United States Patent
Matsumoto

(10) Patent No.: US 12,438,327 B2
(45) Date of Patent: Oct. 7, 2025

(54) BYPASS APPARATUS, LASER APPARATUS, AND ELECTRONIC DEVICE MANUFACTURING METHOD

(71) Applicant: Gigaphoton Inc., Tochigi (JP)

(72) Inventor: Shinichi Matsumoto, Oyama (JP)

(73) Assignee: Gigaphoton Inc., Tochigi (JP)

( * ) Notice: Subject to any disclaimer, the term of this patent is extended or adjusted under 35 U.S.C. 154(b) by 131 days.

(21) Appl. No.: 18/399,011

(22) Filed: Dec. 28, 2023

(65) Prior Publication Data

US 2024/0128702 A1    Apr. 18, 2024

Related U.S. Application Data

(63) Continuation of application No. PCT/JP2021/030232, filed on Aug. 18, 2021.

(51) Int. Cl.
| | |
|---|---|
| *H01S 3/00* | (2006.01) |
| *G03F 7/00* | (2006.01) |
| *H01S 3/23* | (2006.01) |

(52) U.S. Cl.
CPC ........ *H01S 3/0071* (2013.01); *G03F 7/70025* (2013.01); *G03F 7/7015* (2013.01);
(Continued)

(58) Field of Classification Search
CPC .... G03F 7/20; G03F 7/70025; G03F 7/70041; G03F 7/7015; G03F 7/70191;
(Continued)

(56) References Cited

U.S. PATENT DOCUMENTS

| | | |
|---|---|---|
| 2004/0202220 A1 | 10/2004 | Hua et al. |
| 2016/0248219 A1 | 8/2016 | Wakabayashi et al. |

(Continued)

FOREIGN PATENT DOCUMENTS

| | | |
|---|---|---|
| JP | H05-96388 A | 4/1993 |
| JP | H08-015618 A | 1/1996 |

(Continued)

OTHER PUBLICATIONS

International Search Report issued in PCT/JP2021/030232; mailed Oct. 26, 2021.

(Continued)

*Primary Examiner* — Peter B Kim
(74) *Attorney, Agent, or Firm* — Studebaker Brackett PLLC

(57) ABSTRACT

A bypass apparatus is attachable to and detachable from a laser apparatus, and constitutes a bypass optical path bypassing a pulse width stretching apparatus stretching the pulse width of pulse laser light having entered the pulse width stretching apparatus, the bypass apparatus including optical elements constituting the bypass optical path, and an enclosure housing the optical elements, the optical elements including a first highly reflective mirror that reflects the pulse laser light entering the pulse width stretching apparatus out of the pulse width stretching apparatus and that guides the reflected pulse laser light to the bypass optical path, and a second highly reflective mirror reflecting the pulse laser light reflected off the first highly reflective mirror and incident on the second highly reflective mirror through the bypass optical path to cause the reflected pulse laser light to return to a light-exiting-side optical path of the pulse width stretching apparatus.

10 Claims, 16 Drawing Sheets

(52) U.S. Cl.
CPC ...... *G03F 7/70191* (2013.01); *G03F 7/70308* (2013.01); *G03F 7/70316* (2013.01); *G03F 7/70575* (2013.01); *H01S 3/0057* (2013.01); *H01S 3/2308* (2013.01)

(58) Field of Classification Search
CPC ............ G03F 7/70308; G03F 7/70316; G03F 7/70575; H01S 3/005; H01S 3/0057; H01S 3/0071; H01S 3/08009; H01S 3/225; H01S 3/2308; H01S 3/2366
See application file for complete search history.

(56) References Cited

U.S. PATENT DOCUMENTS

| | | | |
|---|---|---|---|
| 2017/0322497 A1 | 11/2017 | Lin et al. | |
| 2021/0016390 A1* | 1/2021 | Ashikawa | ............ H01S 3/0401 |

FOREIGN PATENT DOCUMENTS

| | | |
|---|---|---|
| JP | 2005-148550 A | 6/2005 |
| JP | 2009-188128 A | 8/2009 |
| JP | 2019-516127 A | 6/2019 |
| WO | 2015/092855 A1 | 6/2015 |

OTHER PUBLICATIONS

Written Opinion issued in PCT/JP2021/030232; mailed Oct. 26, 2021.

\* cited by examiner

BYPASS APPARATUS, LASER APPARATUS, AND ELECTRONIC DEVICE MANUFACTURING METHOD

CROSS-REFERENCE TO RELATED APPLICATIONS

The present application is a continuation application of International Application No. PCT/JP2021/030232, filed on Aug. 18, 2021, the entire contents of which are hereby incorporated by reference.

BACKGROUND

1. Technical Field

The present disclosure relates to a bypass apparatus, a laser apparatus, and an electronic device manufacturing method.

2. Related Art

In recent years, a semiconductor exposure apparatus is required to improve the resolution thereof as semiconductor integrated circuits are increasingly miniaturized and highly integrated. To this end, reduction in the wavelength of light output from a light source for exposure is underway. For example, a KrF excimer laser apparatus, which outputs laser light having a wavelength of about 248 nm, and an ArF excimer laser apparatus, which outputs laser light having a wavelength of about 193 nm, are used as a gas laser apparatus for exposure.

Light from spontaneously oscillating KrF and ArF excimer laser apparatuses has a wide spectral linewidth ranging from 350 to 400 pm. A projection lens made of a material that transmits ultraviolet light, such as KrF and ArF laser light, therefore produces chromatic aberrations in some cases. As a result, the resolution of the projection lens may decrease. To avoid the decrease in the resolution, the spectral linewidth of the laser light output from the gas laser apparatus needs to be narrow enough to make the chromatic aberrations negligible. To this end, a line narrowing module (LNM) including a line narrowing element (such as etalon and grating) is provided in some cases in a laser resonator of the gas laser apparatus to narrow the spectral linewidth. A gas laser apparatus providing a narrowed spectral linewidth is hereinafter referred to as a narrowed-line gas laser apparatus.

CITATION LIST

Patent Literature

[PTL 1] JP2005-148550A
[PTL 2] JP8-015618A

SUMMARY

A bypass apparatus according to an aspect of the present disclosure is attachable to and detachable from a laser apparatus configured to output pulse laser light, the bypass apparatus constituting a bypass optical path that bypasses a pulse width stretching apparatus provided in the laser apparatus and configured to stretch a pulse width of the pulse laser light having entered the pulse width stretching apparatus, the bypass apparatus including a plurality of optical elements constituting the bypass optical path, and an enclosure that houses the plurality of optical elements, the plurality of optical elements including a first highly reflective mirror configured to reflect the pulse laser light entering the pulse width stretching apparatus out of the pulse width stretching apparatus, the first highly reflective mirror being configured to guide the reflected pulse laser light to the bypass optical path, and a second highly reflective mirror configured to reflect the pulse laser light reflected off the first highly reflective mirror and incident on the second highly reflective mirror through the bypass optical path to cause the reflected pulse laser light to return to a light-exiting-side optical path of the pulse width stretching apparatus.

A laser apparatus according to another aspect of the present disclosure includes a laser oscillator configured to output pulse laser light; and a pulse width stretching apparatus configured to stretch a pulse width of the pulse laser light having entered the pulse width stretching apparatus. A bypass apparatus is attached to the laser apparatus in a detachable manner, and the bypass apparatus constitutes a bypass optical path that bypasses the pulse width stretching apparatus. The bypass apparatus includes a plurality of optical elements constituting the bypass optical path, and an enclosure that houses the plurality of optical elements. The plurality of optical elements includes a first highly reflective mirror configured to reflect the pulse laser light entering the pulse width stretching apparatus out of the pulse width stretching apparatus, the first highly reflective mirror being configured to guide the reflected pulse laser light to the bypass optical path, and a second highly reflective mirror configured to reflect the pulse laser light reflected off the first highly reflective mirror and incident on the second highly reflective mirror through the bypass optical path to cause the reflected pulse laser light to return to a light-exiting-side optical path of the pulse width stretching apparatus.

An electronic device manufacturing method according to another aspect of the present disclosure includes outputting pulse laser light output from a laser apparatus to an exposure apparatus, and exposing a photosensitive substrate to the pulse laser light in the exposure apparatus to manufacture electronic devices, the laser apparatus including a laser oscillator configured to output the pulse laser light and a pulse width stretching apparatus configured to stretch a pulse width of the pulse laser light having entered the pulse width stretching apparatus, a bypass apparatus being attached to the laser apparatus in a detachable manner, the bypass apparatus constituting a bypass optical path that bypasses the pulse width stretching apparatus, the bypass apparatus including a plurality of optical elements constituting the bypass optical path, and an enclosure that houses the plurality of optical elements, the plurality of optical elements including a first highly reflective mirror configured to reflect the pulse laser light entering the pulse width stretching apparatus out of the pulse width stretching apparatus, the first highly reflective mirror being configured to guide the reflected pulse laser light to the bypass optical path, and a second highly reflective mirror configured to reflect the pulse laser light reflected off the first highly reflective mirror and incident on the second highly reflective mirror through the bypass optical path to cause the reflected pulse laser light to return to a light-exiting-side optical path of the pulse width stretching apparatus.

BRIEF DESCRIPTION OF DRAWINGS

Embodiments of the present disclosure will be described below only by way of example with reference to the accompanying drawings.

DETAILED DESCRIPTION

Contents

Figure 1:
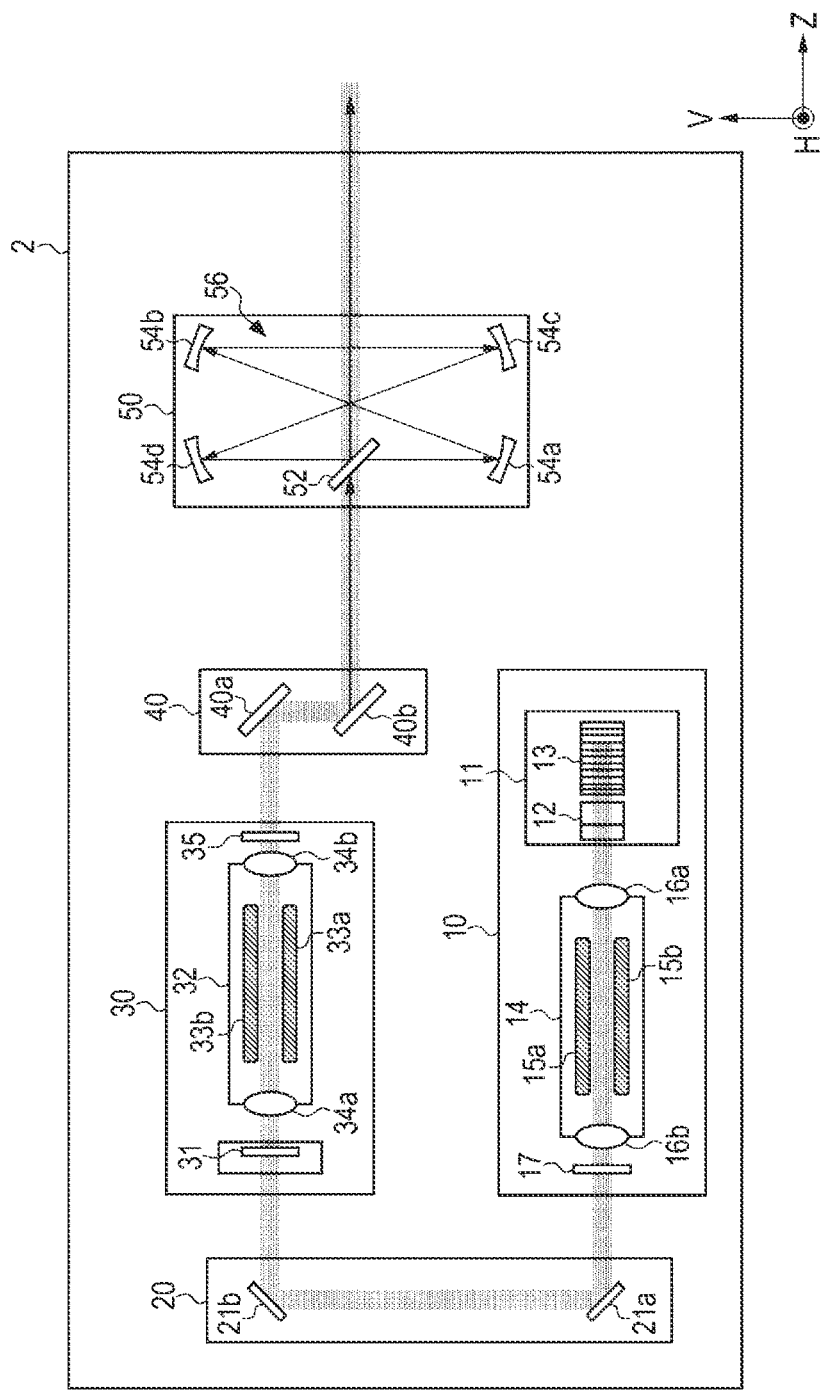
FIG. 1 is a front view schematically showing the configuration of a laser apparatus according to Comparative Example.

1. Comparative Example
1.1 Configuration
1.2 Operation
1.3 Problems
2. First Embodiment
2.1 Configuration
2.2 Operation
2.3 Effects
3. Second Embodiment
3.1 Configuration
3.2 Operation
3.3 Effects
4. Third Embodiment
4.1 Configuration
4.2 Operation
4.3 Effects
5. Modifications of bypass apparatus
5.1 First modification
5.2 Second modification
5.3 Other modifications
6. Electronic device manufacturing method Embodiments of the present disclosure will be described below in detail with reference to the drawings. The embodiments described below show some examples of the present disclosure and are not intended to limit the contents of the present disclosure. Furthermore, all configurations and operations described in the embodiments are not necessarily essential as configurations and operations in the present disclosure. The same component has the same reference character, and no redundant description of the same component will be made.

1. Comparative Example 1.1 Configuration

FIG. 1 schematically shows an example of the configuration of a laser apparatus 2 according to Comparative Example. Comparative Example in the present disclosure is an aspect that the applicant is aware of as known only by the applicant, and is not a publicly known example that the applicant is self-aware of.

In FIG. 1, it is assumed that a V-axis direction is the height direction of the laser apparatus 2, a Z-axis direction is the length direction thereof, and an H-axis direction is the depth direction thereof. The V-axis direction may be parallel to the direction of gravity, and "the direction toward the positive end of the V-axis" is assumed to be the direction opposite to the direction of gravity. "The direction toward the positive end of the Z-axis direction" is assumed to be the direction in which pulse laser light output from the laser apparatus 2 exits. "The direction toward the positive end of the H-axis direction" is assumed to be the direction in the plane of view of FIG. 1 toward the reader of the specification.

The laser apparatus 2 includes a master oscillator (MO) 10, an MO beam steering unit 20, a power oscillator (PO) 30, a PO beam steering unit 40, and an optical pulse stretcher (OPS) 50.

The master oscillator 10 includes a line narrowing module (LNM) 11, a chamber 14, and an output coupler (OC) 17.

The LNM 11 includes a prism beam expander 12 and a grating 13, which narrow the spectral linewidth. The prism beam expander 12 and the grating 13 are disposed in the Littrow arrangement, which causes the angle of incidence of the light incident on the grating 13 to be equal to the angle of diffraction of the light diffracted by the grating 13.

The output coupler 17 is a reflective mirror having a reflectance ranging from 40% to 60%. The output coupler 17 and the LNM 11 are arranged to constitute an optical resonator.

The chamber 14 is disposed on the optical path of the optical resonator. The chamber 14 includes a pair of discharge electrodes 15a and 15b and two windows 16a and 16b, through which the pulse laser light passes. The chamber 14 accommodates an excimer laser gas. The excimer laser gas may contain, for example, an Ar or Kr gas as a rare gas, an $F_2$ gas as a halogen gas, and an Ne gas as a buffer gas.

The MO beam steering unit 20 includes highly reflective mirrors 21a and 21b. The highly reflective mirrors 21a and 21b are so disposed that the pulse laser light output from the master oscillator 10 enters the power oscillator 30. The highly reflective mirrors in the present disclosure are each, for example, a planar mirror including a substrate that is made of synthetic quartz or calcium fluoride ($CaF_2$) and that has a surface on which a highly reflective film is formed. The highly reflective film is a dielectric multilayer film, for example, a film containing fluoride.

The power oscillator 30 includes a rear mirror 31, a chamber 32, and an output coupler 35. The rear mirror 31 and the output coupler 35 are arranged to constitute an optical resonator.

The chamber 32 is disposed on the optical path of the optical resonator. The chamber 32 may have the same configuration as that of the chamber 14 of the master oscillator 10. That is, the chamber 32 includes a pair of discharge electrodes 33a and 33b and two windows 34a and 34b, through which the pulse laser light passes. The chamber 32 accommodates an excimer laser gas.

The rear mirror 31 is a reflective mirror having a reflectance ranging from 50% to 90%. The output coupler 35 is a reflective mirror having a reflectance ranging from 10% to 30%.

The PO beam steering unit 40 includes highly reflective mirrors 40a and 40b. The highly reflective mirrors 40a and 40b are so disposed that the pulse laser light output from the power oscillator 30 enters the OPS 50.

The OPS 50 includes a beam splitter 52 and four concave mirrors 54a to 54d. The beam splitter 52 is disposed on the optical path of the pulse laser light output from the PO beam steering unit 40. The beam splitter 52 is a reflective mirror that transmits part of the pulse laser light incident thereon and reflects the other part of the pulse laser light. The reflectance of the beam splitter 52 preferably ranges from 40% to 70%, and is more preferably about 60%. The beam splitter 52 outputs the pulse laser light having passed through the beam splitter 52 from the laser apparatus 2.

The four concave mirrors 54a to 54d constitute an optical delay path 56, which delays the pulse laser light reflected off a first surface of the beam splitter 52. The pulse laser light reflected off the first surface of the beam splitter 52 is reflected off the four concave mirrors 54a to 54d and brought into focus at the beam splitter 52 again.

The four concave mirrors 54a to 54d may be concave mirrors having substantially the same focal lengths. A focal length f of each of the concave mirrors 54a to 54d may correspond, for example, to the distance from the beam splitter 52 to the concave mirror 54a.

The concave mirrors 54a and 54b are so arranged that the pulse laser light reflected off the first surface of the beam splitter 52 is reflected off the concave mirror 54a and incident on the concave mirror 54b. The concave mirrors 54a and 54b are disposed to cause the pulse laser light reflected off the first surface of the beam splitter 52 to bring an image at the first surface of the beam splitter 52 into focus as a first image at equal magnification (1:1).

The concave mirrors 54c and 54d are so arranged that the pulse laser light reflected off the concave mirror 54b is reflected off the concave mirror 54c and incident on the concave mirror 54d. Furthermore, the concave mirror 54d is disposed to cause the pulse laser light reflected off the concave mirror 54d to be incident on a second surface of the beam splitter 52, that is the surface opposite to the first surface. The concave mirrors 54c and 54d are disposed to bring the first image into focus as a second image at equal magnification (1:1) at the second surface of the beam splitter 52.

Note that the OPS 50 only needs to include a beam splitter and two or more highly reflective mirrors.

1.2 Operation

When discharge occurs in the chamber 14 of the master oscillator 10, the laser gas is excited, and the pulse laser light having a linewidth narrowed by the optical resonator including the output coupler 17 and the LNM 11 is output via the output coupler 17. The MO beam steering unit 20 causes the pulse laser light to be incident as seed light on the rear mirror 31 of the power oscillator 30.

In synchronization with the timing at which the seed light having passed through the rear mirror 31 enters the chamber 32, discharge occurs in the chamber 32. As a result, the laser gas is excited, the seed light is amplified by the Fabry-Perot-type optical resonator including the output coupler 35 and the rear mirror 31, and the amplified pulse laser light is output via the output coupler 35. The pulse laser light output via the output coupler 35 enters the OPS 50 via the PO beam steering unit 40.

A part of the pulse laser light having entered the OPS 50 passes through and is output via the beam splitter 52, and another part of the pulse laser light is reflected off the beam splitter 52. The pulse laser light reflected off the beam splitter 52 makes the circulation of the optical delay path 56 formed by the first to fourth concave mirrors 54a to 54d, and is incident on the beam splitter 52 again. A part of the pulse laser light incident on the beam splitter 52 is then reflected off and output from the OPS 50. The pulse laser light having passed through the beam splitter 52 makes the circulation of the optical delay path 56 again.

When the pulse laser light repeatedly makes the circulation of the optical delay path 56 as described above, the OPS 50 outputs pulse laser light having made the circulation none, once, twice, three times, and so on. The optical intensity of the pulse laser light output from the OPS 50 decreases as the number of circulations of the optical delay path 56 increases.

The pulse laser light having made the circulation once, the pulse laser light having made the circulation twice, and so on are each delayed with respect to the pulse laser light having made the circulation none by an integer multiple of the delay period determined by the optical path length of the optical delay path 56, and are combined with one another and output. That is, the pulse waveform of the pulse laser light having made the circulation none is sequentially superimposed with the pulse waveform of the pulse laser light having made the circulation once and thereafter each delayed by the corresponding delay period. The pulse width of the pulse laser light is thus extended by the OPS 50.

The pulse laser light having the pulse width extended by the OPS 50 has lowered coherence. Occurrence of speckles is thus suppressed. Speckles are bright and dark spots caused by interference when laser light is scattered by a random medium.

1.3 Problems

The laser apparatus 2 according to Comparative Example may have abnormal laser performance due, for example, to defects thereof. Examples of the abnormal laser performance may include a decrease in the power of the pulse laser light and deterioration of the beam characteristics of the pulse laser light. The deterioration of the beam characteristics is, for example, an increase in beam divergence.

When the abnormal laser performance occurs, it is conceivable to remove the OPS 50 and check the laser performance again to identify the cause of the abnormality. The reason for this is to identify whether the abnormal laser performance is caused by the laser oscillator (master oscillator 10 or power oscillator 30) or the OPS 50. For example, when the power of the pulse laser light decreases, it is conceivable that the decrease in power is caused by a decrease in the output of the laser oscillator or a decrease in the optical transmittance of the OPS 50. When the laser performance does not improve even after the OPS 50 is removed, it can be determined that the problem is caused by the laser oscillator, whereas when the laser performance improves by removing the OPS 50, it can be determined that the problems is caused by the OPS 50.

However, the work of removing the OPS 50 from the laser apparatus 2 and attaching the OPS again to the laser apparatus 2 may take, for example, at least half a day, and the factory's production line may have to be stopped during that period. Furthermore, when the removed OPS 50 is reinstalled in the laser apparatus 2, the adjusted optical axis of the OPS 50 before the removal may not be reproduced. In this case, the optical axis needs to be adjusted again, which may take an additional period.

When the abnormal laser performance occurs, identification of the cause of the abnormality in a short period is required.

2. First Embodiment

2.1 Configuration

Figure 2:
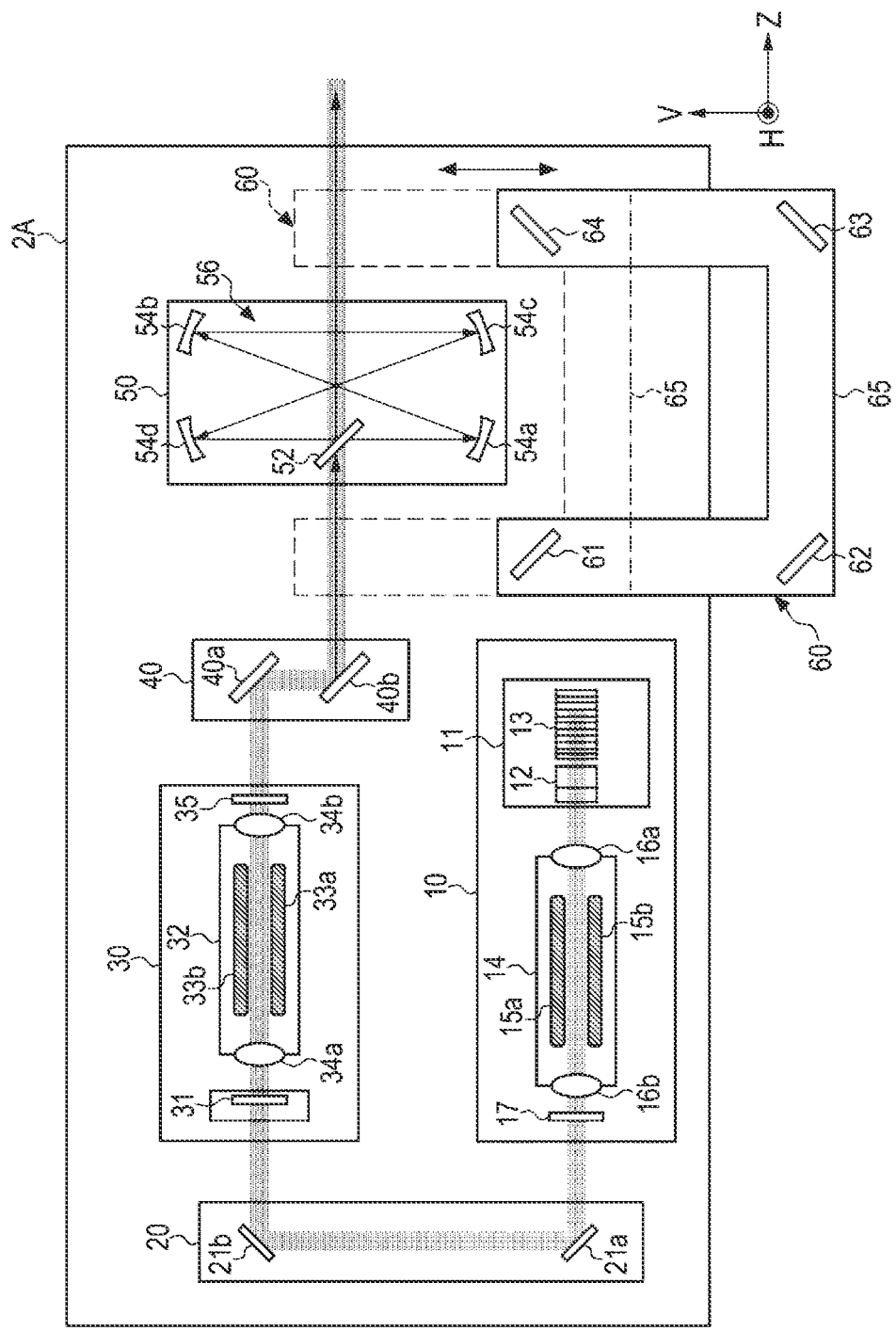
FIG. 2 is a front view schematically showing an example of the configuration of a laser apparatus according to a first embodiment.

FIG. 2 schematically shows an example of the configuration of a laser apparatus 2A according to a first embodiment of the present disclosure. Differences in configuration between the laser apparatus 2A shown in FIG. 2 and the laser apparatus 2 according to Comparative Example shown in FIG. 1 will be described. The laser apparatus 2A according to the first embodiment differs from the laser apparatus 2 according to Comparative Example in that a bypass apparatus 60 is attachable to and detachable from the laser apparatus 2A.

The laser apparatus 2A includes the master oscillator 10, the MO beam steering unit 20, the power oscillator 30, the PO beam steering unit 40, and the OPS 50. The elements described above may have the same configurations as those in the laser apparatus 2 shown in FIG. 1. The master oscillator 10 or the combination of the master oscillator 10 and the power oscillator 30 is an example of the "laser oscillator" in the present disclosure. The OPS 50 is an example of the "pulse width stretching apparatus" in the present disclosure. The PO beam steering unit 40 is an example of the "beam steering apparatus" in the present disclosure.

The bypass apparatus 60 forms a bypass optical path that bypasses the optical delay path 56 accommodated in the OPS 50. The bypass apparatus 60 includes four highly reflective mirrors 61 to 64. The highly reflective mirrors 61 to 64 are an example of the "plurality of optical elements" in the present disclosure. The highly reflective mirror 61 is an example of the "first highly reflective mirror" in the present disclosure. The highly reflective mirror 64 is an example of the "second highly reflective mirror" in the present disclosure.

The highly reflective mirrors 61 to 64 are housed in an enclosure 65 and held at predetermined positions in the enclosure 65. The highly reflective mirrors 61 to 64 form the bypass optical path that bypasses the OPS 50.

The laser apparatus 2A has a space secured on the light incident side and the light exiting side of the OPS 50, and a portion of the bypass apparatus 60 can be inserted into the space. The enclosure 65 of the bypass apparatus 60 is attachable to and detachable from the laser apparatus 2A. In FIG. 2, the broken line indicates the position where the bypass apparatus 60 is attached to the laser apparatus 2A. The enclosure 65 is positioned and fixed with respect to the OPS 50 when attached to the laser apparatus 2A. In FIG. 2, the solid line indicates the state in which the bypass apparatus 60 is detached from the laser apparatus 2A.

Figure 3:
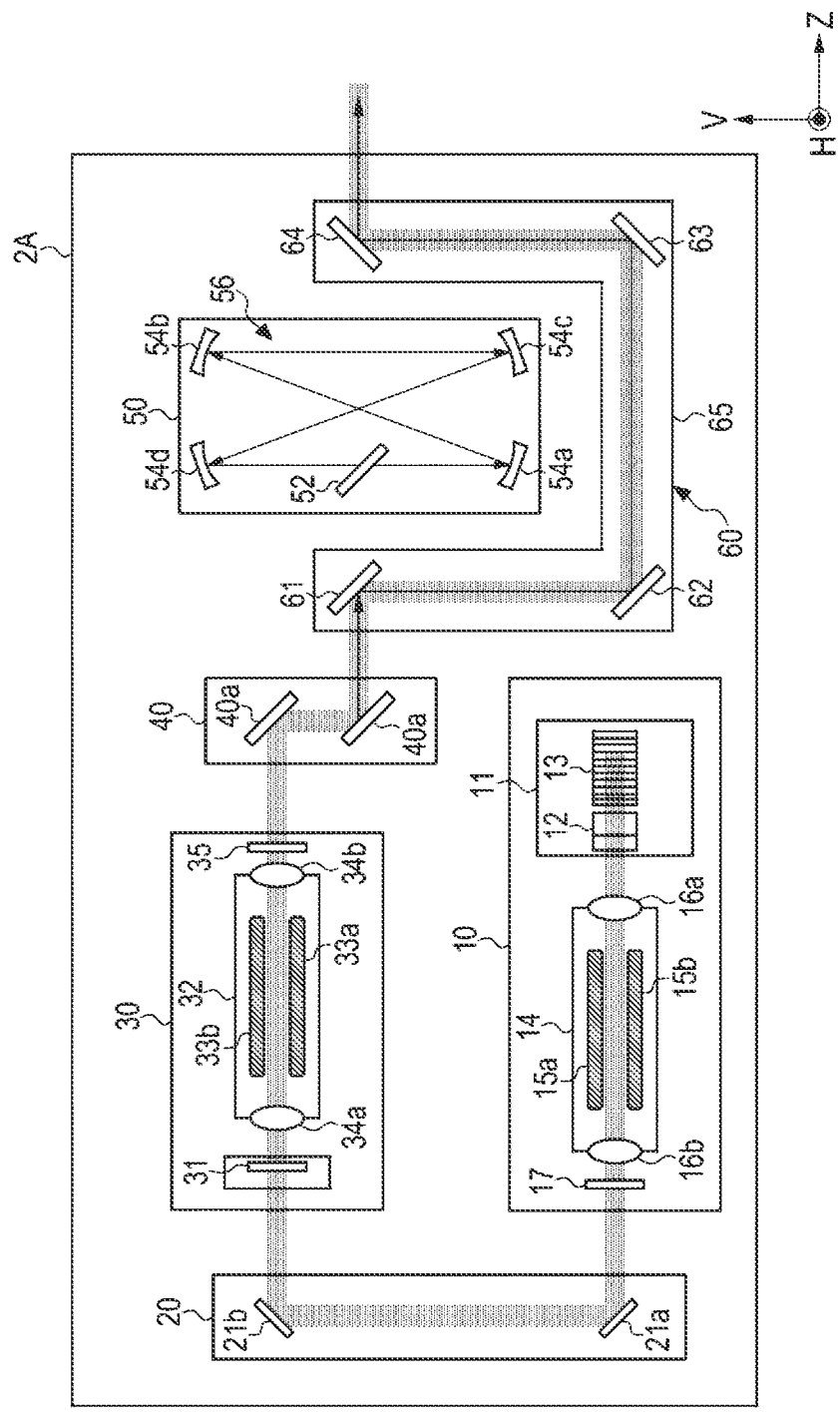
FIG. 3 is a front view showing the state in which a bypass apparatus is attached to the laser apparatus according to the first embodiment.

FIG. 3 shows the state in which the bypass apparatus 60 is attached to the laser apparatus 2A. In the state in which the bypass apparatus 60 is attached to the laser apparatus 2A, the highly reflective mirror 61 is disposed to reflect the pulse laser light output from the PO beam steering unit 40 and cause the reflected pulse laser light to be incident on the highly reflective mirror 62. For example, the highly reflective mirror 61 is disposed so as to incline by an angle of 45° with respect to the light-incident-side optical axis of the OPS 50, and reflect the pulse laser light traveling along the light-incident-side optical axis at an angle of reflection of 45°.

The highly reflective mirrors 62 and 63 are disposed to guide the pulse laser light reflected off the highly reflective mirror 61 to the highly reflective mirror 64. For example, the highly reflective mirror 62 is disposed to reflect the pulse laser light incident from the highly reflective mirror 61 at the angle of reflection of 45° and cause the reflected pulse laser light to be incident on the highly reflective mirror 63. The highly reflective mirror 63 is disposed to reflect the pulse laser light incident from the highly reflective mirror 62 at the angle of reflection of 45° and cause the reflected pulse laser light to be incident on the highly reflective mirror 64.

The highly reflective mirror 64 is disposed so as to incline by the angle of 45° with respect to the light-exiting-side optical axis of the OPS 50, and reflect the pulse laser light incident from the highly reflective mirror 63 at the angle of reflection of 45° to cause the reflected pulse laser light to return to the light-exiting side optical path of the OPS 50. That is, the highly reflective mirror 64 is disposed to output the pulse laser light having traveled through the bypass optical path to the optical path of the pulse laser light output from the OPS 50 when the bypass apparatus 60 is not attached to the laser apparatus 2A.

That is, the highly reflective mirrors 61 to 64 are each so disposed that the angle between the light incident on the mirror and the light reflected off the mirror is 90°.

A light incident window (not shown) is formed in the enclosure 65 of the bypass apparatus 60 to allow the pulse laser light output from the PO beam steering unit 40 to be incident on the highly reflective mirror 61. A light exiting window (not shown) is formed in the enclosure 65 to output the pulse laser light reflected off the highly reflective mirror 64 out of the enclosure 65.

The highly reflective mirrors 61 to 64 may each be so disposed that the angle between the light incident on the mirror and the light reflected off the mirror is not 90°. The highly reflective mirror 61 as the first highly reflective mirror only needs to be disposed so as to guide the pulse laser light to the bypass optical path by reflecting the pulse laser light entering the OPS 50 out of the OPS 50. The highly reflective mirror 64 as the second highly reflective mirror only needs to be disposed so as to cause the pulse laser light to return to the light-exiting-side optical path of the OPS 50 by reflecting the pulse laser light reflected off the highly reflective mirror 61 and incident on the highly reflective mirror 64 via the bypass optical path.

2.2 Operation

When the bypass apparatus 60 is not attached to the laser apparatus 2A, the pulse laser light output from the power oscillator 30 enters the OPS 50 via the PO beam steering unit 40. The pulse laser light having entered the OPS 50 is output from the laser apparatus 2A after the pulse width of the pulse laser light is extended by the optical delay path 56.

The bypass apparatus 60 is attached to the laser apparatus 2A, for example, when the pulse laser light output from the laser apparatus 2A has abnormal laser performance and during investigation work for identifying the cause of the abnormality. When the bypass apparatus 60 is attached to the laser apparatus 2A, the pulse laser light output from the PO beam steering unit 40 and traveling along the light-incident-side optical axis of the OPS 50 enters the bypass apparatus 60, travels along the bypass optical path without passing through the OPS 50, and is then output along the light-exiting-side optical axis of the OPS 50.

2.3 Effects

The laser apparatus 2A and the bypass apparatus 60 according to the first embodiment, in which the bypass apparatus 60 is attached to the laser apparatus 2A, can output the pulse laser light with the OPS 50 attached to the laser apparatus 2A but the pulse laser light bypassing the OPS 50. Therefore, when the laser apparatus 2A has abnormal laser performance, the cause of the abnormality can be readily identified and investigated by attaching and detaching the bypass apparatus 60 to and from the laser apparatus 2A.

Attaching the bypass apparatus 60 does not change the angles of mirrors, such as those disposed in the optical path in the OPS 50, and detaching the bypass apparatus 60 returns the optical path to the original state thereof, so that there is no need to adjust the optical axis. The overall work period relating to the identification of the cause of the abnormality can thus be shortened.

Since the bypass apparatus 60 can be readily attached to and detached from the laser apparatus 2A, the pulse width of the pulse laser light can be switched from one to the other by attaching and detaching the bypass apparatus 60. The output of the pulse laser light decreases when the pulse laser light passes through the OPS 50, so that when the bypass apparatus 60 is attached to the laser apparatus 2A, the pulse width of the pulse laser light narrows, but the output thereof increases. Attaching and detaching the bypass apparatus 60 therefore allows selection of which of the pulse width and the output of the pulse laser light should be prioritized, so that the practical performance of the laser apparatus 2A can be increased.

3. Second Embodiment

A laser apparatus 2B according to a second embodiment of the present disclosure will next be described. Differences in configuration between the laser apparatus 2B according to the second embodiment and the laser apparatus 2 according to Comparative Example will be described below.

3.1 Configuration

Figure 4:
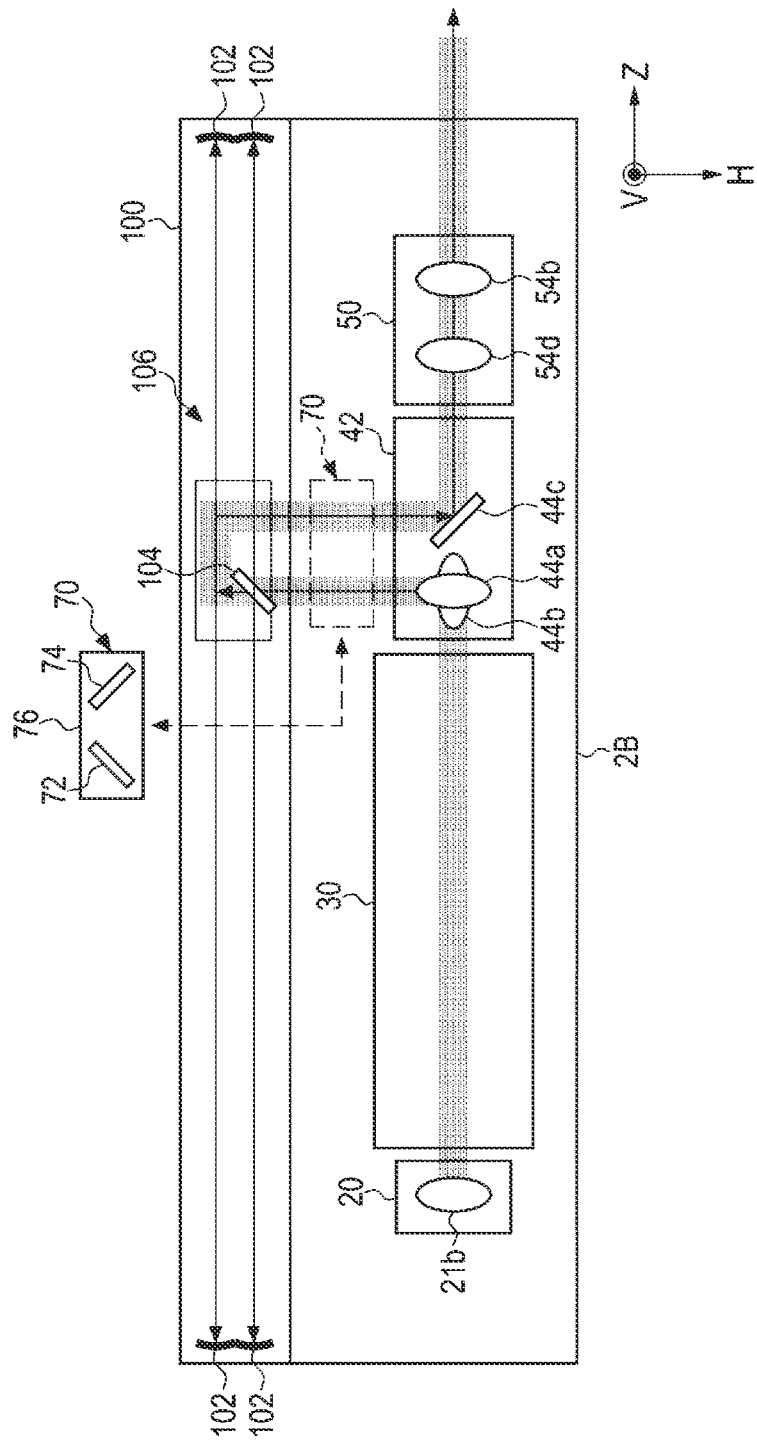
FIG. 4 is a top view schematically showing the configuration of a laser apparatus according to a second embodiment.
Figure 5:
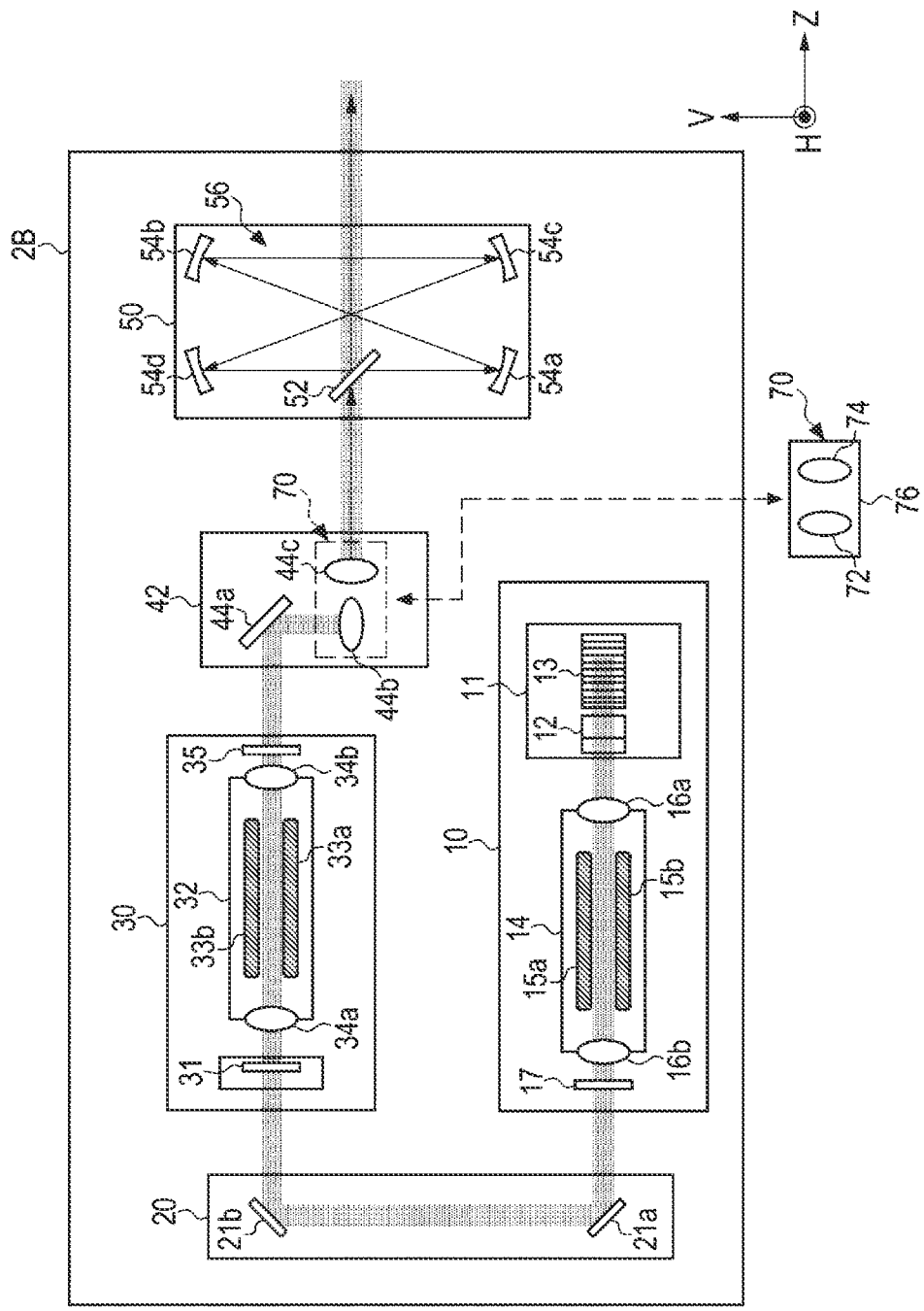
FIG. 5 is a front view schematically showing the configuration of the laser apparatus according to the second embodiment.

FIG. 4 is a top view schematically showing the configuration of the laser apparatus 2B according to the second embodiment. FIG. 5 is a front view schematically showing the configuration of the laser apparatus 2B. Note that the term "front surface" relating to the laser apparatus 2B refers to the surface, out of the outer circumferential surfaces of the laser apparatus 2B, facing the side where an exterior cover panel that is not shown opens wide for maintenance of the laser apparatus 2B and other purposes. The "front surface" is the surface facing the side where the internal layout of the laser apparatus, such as that shown in FIG. 5, is viewed when the exterior cover panel of the laser apparatus 2B is opened.

The laser apparatus 2B includes the master oscillator 10, the MO beam steering unit 20, the power oscillator 30, and the OPS 50. The elements described above may have the same configurations as those in the laser apparatus 2 shown in FIG. 1.

The laser apparatus 2B includes a long optical pulse stretcher 100 (hereinafter referred to as "L-OPS 100") for creating a long-distance optical path difference that stretches the pulse width. The L-OPS 100 is disposed at the rear surface of the laser apparatus 2B. The "rear surface" is a surface away from the front surface of the laser apparatus 2B in the depth direction when the laser apparatus 2B is viewed from the front side and is the surface opposite to the front surface. The L-OPS 100 is an example of the "pulse width stretching apparatus" in the present disclosure.

The laser apparatus 2B includes a PO beam steering unit 42 in place of the PO beam steering unit 40 shown in FIG. 1. The PO beam steering unit 42 includes highly reflective mirrors 44a, 44b, and 44c for sending and receiving light to and from the L-OPS 100.

The highly reflective mirror 44a is disposed to reflect the pulse laser light output from the power oscillator 30 and cause the reflected pulse laser light to be incident on the highly reflective mirror 44b. The highly reflective mirror 44b is disposed to reflect the pulse laser light reflected off the highly reflective mirror 44a and cause the reflected pulse laser light to enter the L-OPS 100. The highly reflective mirror 44c is disposed to reflect the pulse laser light output from the L-OPS 100 and cause the reflected pulse laser light to enter the OPS 50.

The L-OPS 100 includes a plurality of concave mirrors, a plurality of highly reflective mirrors, and a plurality of beam splitters. FIG. 4 shows only a plurality of concave mirrors 102 and one beam splitter 104 out of the components of the L-OPS 100. The beam splitter 104 is located to receive the pulse laser light reflected off the highly reflective mirror 44b of the PO beam steering unit 42. The L-OPS 100 has an optical delay path 106 including the components described above. That is, the laser apparatus 2B according to the second embodiment includes two pulse width stretching apparatuses, the OPS 50 and the L-OPS 100. The OPS 50 and the L-OPS 100 each only need to include a beam splitter and two or more highly reflective mirrors.

A bypass apparatus 70 is attachable to and detachable from the laser apparatus 2B. The bypass apparatus 70 includes two highly reflective mirrors 72 and 74. The highly reflective mirrors 72 and 74 are an example of the "plurality of optical elements" in the present disclosure. The highly reflective mirror 72 is an example of the "first highly reflective mirror" in the present disclosure. The highly reflective mirror 74 is an example of the "second highly reflective mirror" in the present disclosure.

The highly reflective mirrors 72 and 74 are housed in an enclosure 76 and held at predetermined positions in the enclosure 76. The highly reflective mirrors 72 and 74 form a bypass optical path that bypasses the L-OPS 100.

In the laser apparatus 2B, a space into which the bypass apparatus 70 can be inserted is secured between the L-OPS 100 and the PO beam steering unit 42. The enclosure 76 of the bypass apparatus 70 is attachable to and detachable from the laser apparatus 2B. In FIGS. 4 and 5, the broken line indicates the position where the bypass apparatus 70 is attached to the laser apparatus 2B. The enclosure 76 is positioned and fixed with respect to the PO beam steering unit 42 when attached to the laser apparatus 2B. In FIGS. 4 and 5, the solid line indicates the state in which the bypass apparatus 70 is detached from the laser apparatus 2B.

Figure 6:
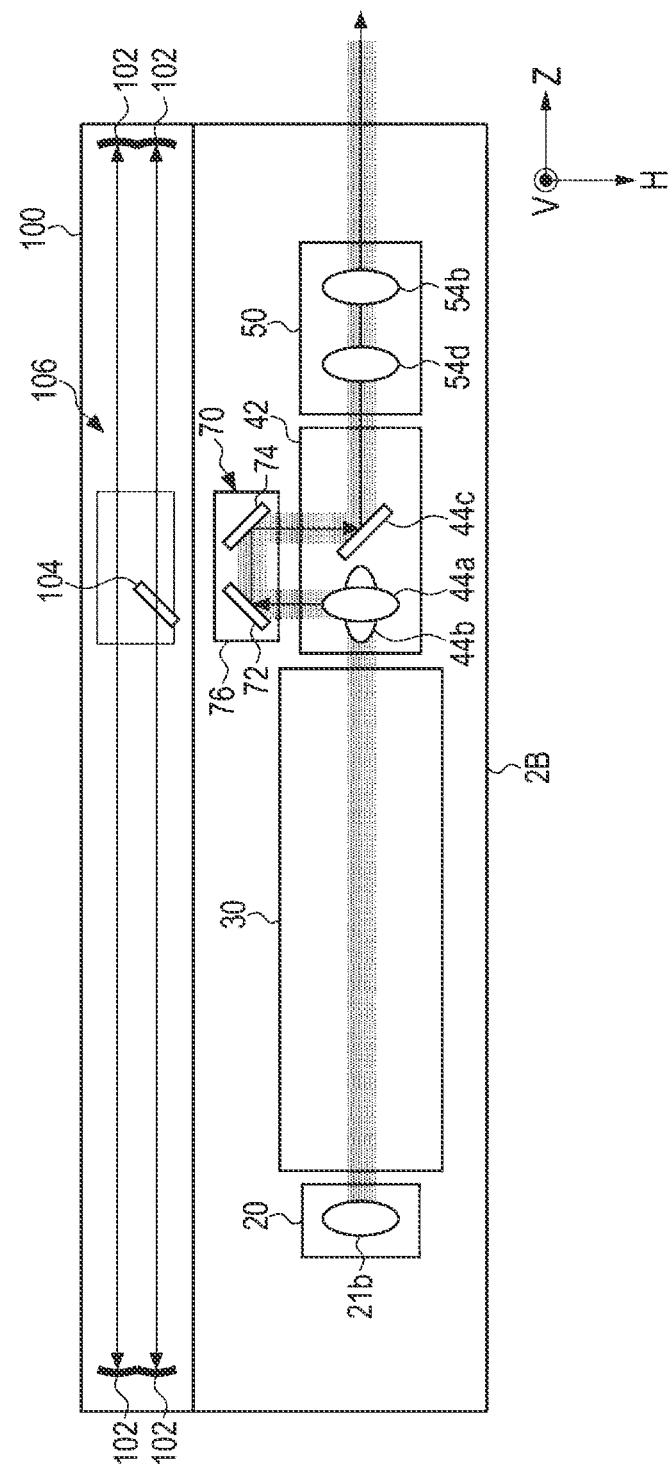
FIG. 6 is a top view showing the state in which a bypass apparatus is attached to the laser apparatus according to the second embodiment.
Figure 7:
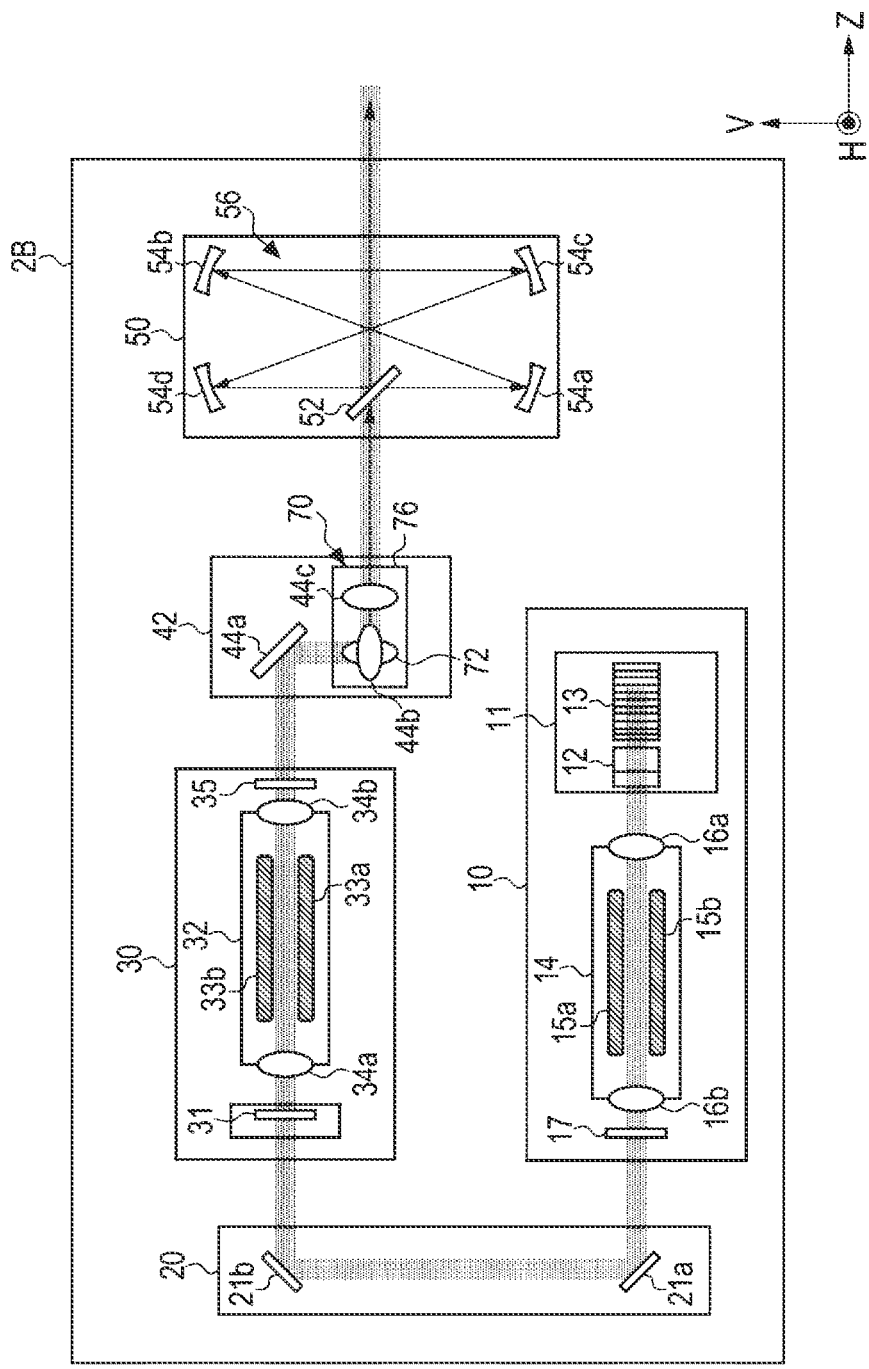
FIG. 7 is a front view showing the state in which the bypass apparatus is attached to the laser apparatus according to the second embodiment.

FIGS. 6 and 7 show the state in which the bypass apparatus 70 is attached to the laser apparatus 2B. In the state in which the bypass apparatus 70 is attached to the laser apparatus 2B, the highly reflective mirror 72 is disposed to reflect the pulse laser light output from the PO beam steering unit 42 and cause the reflected pulse laser light to be incident on the highly reflective mirror 74. For example, the highly reflective mirror 72 is disposed so as to incline by the angle of 45° with respect to the light-incident-side optical axis of the L-OPS 100, and reflect the pulse laser light traveling along the light-incident-side optical axis at the angle of reflection of 45°.

The highly reflective mirror 74 is disposed to reflect the pulse laser light incident from the highly reflective mirror 72 and cause the reflected pulse laser light to be incident on the highly reflective mirror 44c of the PO beam steering unit 42. For example, the highly reflective mirror 74 is disposed so as to incline by the angle of 45° with respect to the light-exiting-side optical axis of the L-OPS 100, and reflect the pulse laser light incident from the highly reflective mirror 72 at the angle of reflection of 45° to cause the reflected pulse laser light to return to the light-exiting side optical path of the L-OPS 100. That is, the highly reflective mirror 74 is disposed to output the pulse laser light having traveled through the bypass optical path to the optical path of the pulse laser light output from the L-OPS 100 when the bypass apparatus 70 is not attached to the laser apparatus 2B.

The highly reflective mirrors 72 and 74 are each so disposed that the angle between the light incident on the mirror and the light reflected off the mirror is 90°.

Figure 8:
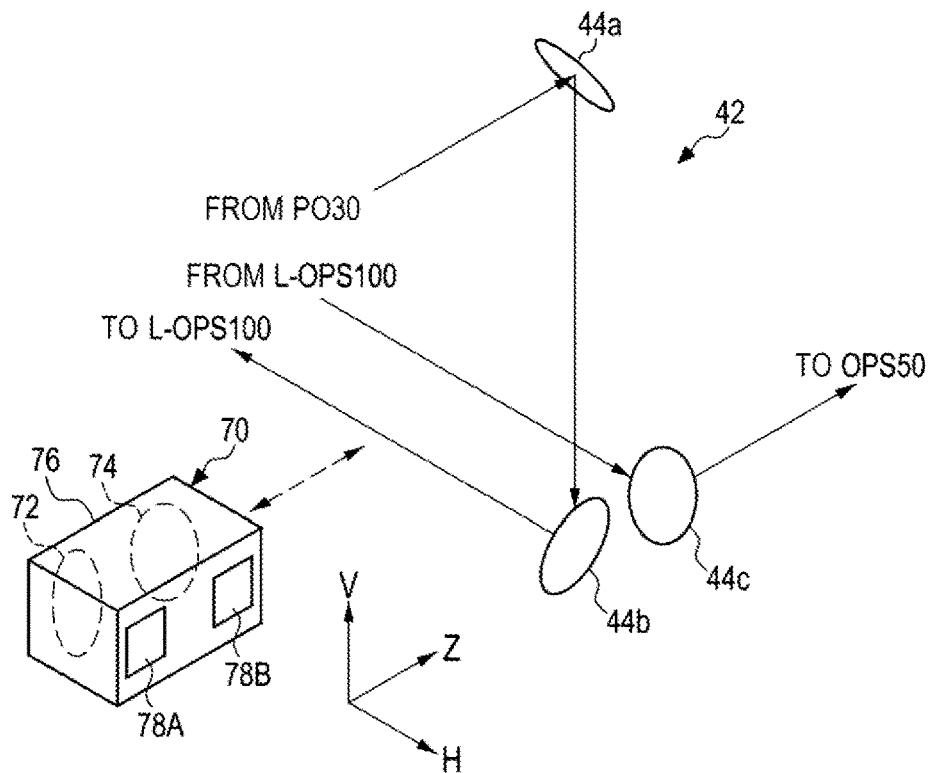
FIG. 8 is a perspective view showing the state in which the bypass apparatus is detached from the laser apparatus according to the second embodiment.
Figure 9:
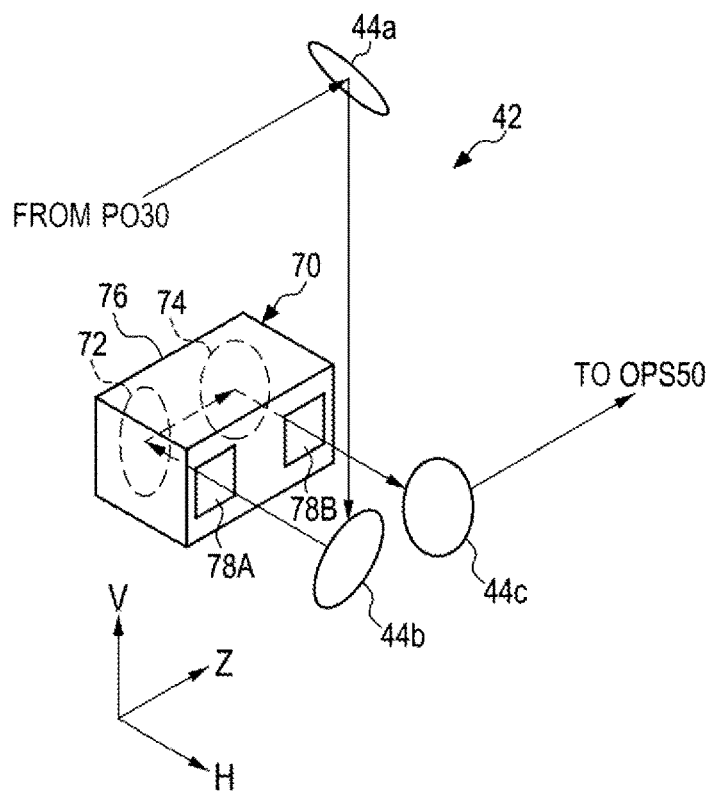
FIG. 9 is a perspective view showing the state in which the bypass apparatus is attached to the laser apparatus according to the second embodiment.

FIGS. 8 and 9 are perspective views schematically showing the configuration of the bypass apparatus 70. FIG. 8 shows the state in which the bypass apparatus 70 is detached from the laser apparatus 2B. FIG. 9 shows the state in which the bypass apparatus 70 is attached to the laser apparatus 2B.

A light incident window 78A is formed in the enclosure 76 of the bypass apparatus 70 to allow the pulse laser light output from the PO beam steering unit 42 to be incident on the highly reflective mirror 72. A light exiting window 78B is formed in the enclosure 76 to allow the pulse laser light reflected off the highly reflective mirror 74 to exit out of the enclosure 76.

The highly reflective mirrors 72 and 74 may each be so disposed that the angle between the light incident on the mirror and the light reflected off the mirror is not 90°. The highly reflective mirror 72 as the first highly reflective mirror only needs to be disposed so as to guide the pulse laser light to the bypass optical path by reflecting the pulse laser light entering the L-OPS 100 out of the L-OPS 100. The highly reflective mirror 74 as the second highly reflective mirror only needs to be disposed so as to cause the pulse laser light to return to the light-exiting-side optical path of the L-OPS 100 by reflecting the pulse laser light reflected off the highly reflective mirror 72 and incident on the highly reflective mirror 74 via the bypass optical path.

3.2 Operation

When the bypass apparatus 70 is not attached to the laser apparatus 2B, the traveling direction of the pulse laser light output from the power oscillator 30 is changed by the highly reflective mirrors 44a and 44b of the PO beam steering unit 42. The pulse laser light that travels in the direction changed by the highly reflective mirrors 44a and 44b enters the L-OPS 100 at the rear surface of the laser apparatus 2B.

The pulse laser light having entered the L-OPS 100 is caused to return to the PO beam steering unit 42 after the pulse width of the pulse laser light is extended by the optical delay path 106. The pulse laser light having returned to the PO beam steering unit 42 travels in the direction changed by the highly reflective mirror 44c and enters the OPS 50. The pulse width of the pulse laser light having entered the OPS 50 is further extended by the OPS 50, and the resultant pulse laser light exits out of the laser apparatus 2B.

The bypass apparatus 70 is attached to the laser apparatus 2B, for example, when the pulse laser light output from the laser apparatus 2B has abnormal laser performance and during the investigation work for identifying the cause of the abnormality. When the bypass apparatus 70 is attached to the laser apparatus 2B, the pulse laser light output from the highly reflective mirror 44b of the PO beam steering unit 42 and traveling along the light-incident-side optical axis of the L-OPS 100 enters the bypass apparatus 70. The pulse laser light having entered the bypass apparatus 70 travels along the bypass optical path without passing through the L-OPS 100, and is output along the light-exiting-side optical axis of the L-OPS 100. The pulse laser light output from the bypass apparatus 70 returns to the PO beam steering unit 42. The pulse laser light having returned to the PO beam steering unit 42 travels in the direction changed by the highly reflective mirror 44c and enters the OPS 50. The pulse width of the pulse laser light having entered the OPS 50 is extended by the OPS 50, and the resultant pulse laser light exits out of the laser apparatus 2B.

3.3 Effects

The laser apparatus 2B and the bypass apparatus 70 according to the second embodiment, in which the bypass apparatus 70 is attached to the laser apparatus 2B, can output the pulse laser light with the L-OPS 100 attached to the laser apparatus 2B but the pulse laser light bypassing the L-OPS 100. Therefore, when the laser apparatus 2B has abnormal laser performance, the cause of the abnormality can be readily identified and investigated by attaching and detaching the bypass apparatus 70 to and from the laser apparatus 2B.

Attaching the bypass apparatus 70 does not change the angles of mirrors, such as those disposed in the optical path in the L-OPS 100, and detaching the bypass apparatus 70 returns the optical path to the original state thereof, so that there is no need to adjust the optical axis. The overall work period relating to the identification of the cause of the abnormality can thus be shortened.

Since the bypass apparatus 70 is readily attached to and detached from the laser apparatus 2B, as in the first embodiment, attaching and detaching the bypass apparatus 70 allows selection of which of the pulse width and the output of the pulse laser light should be prioritized, so that the practical performance of the laser apparatus 2B can be increased.

4. Third Embodiment

A laser apparatus 2C according to a third embodiment of the present disclosure will next be described. Differences in configuration between the laser apparatus 2C according to the third embodiment and the laser apparatus 2B according to the second embodiment will be described below.

4.1 Configuration

Figure 10:
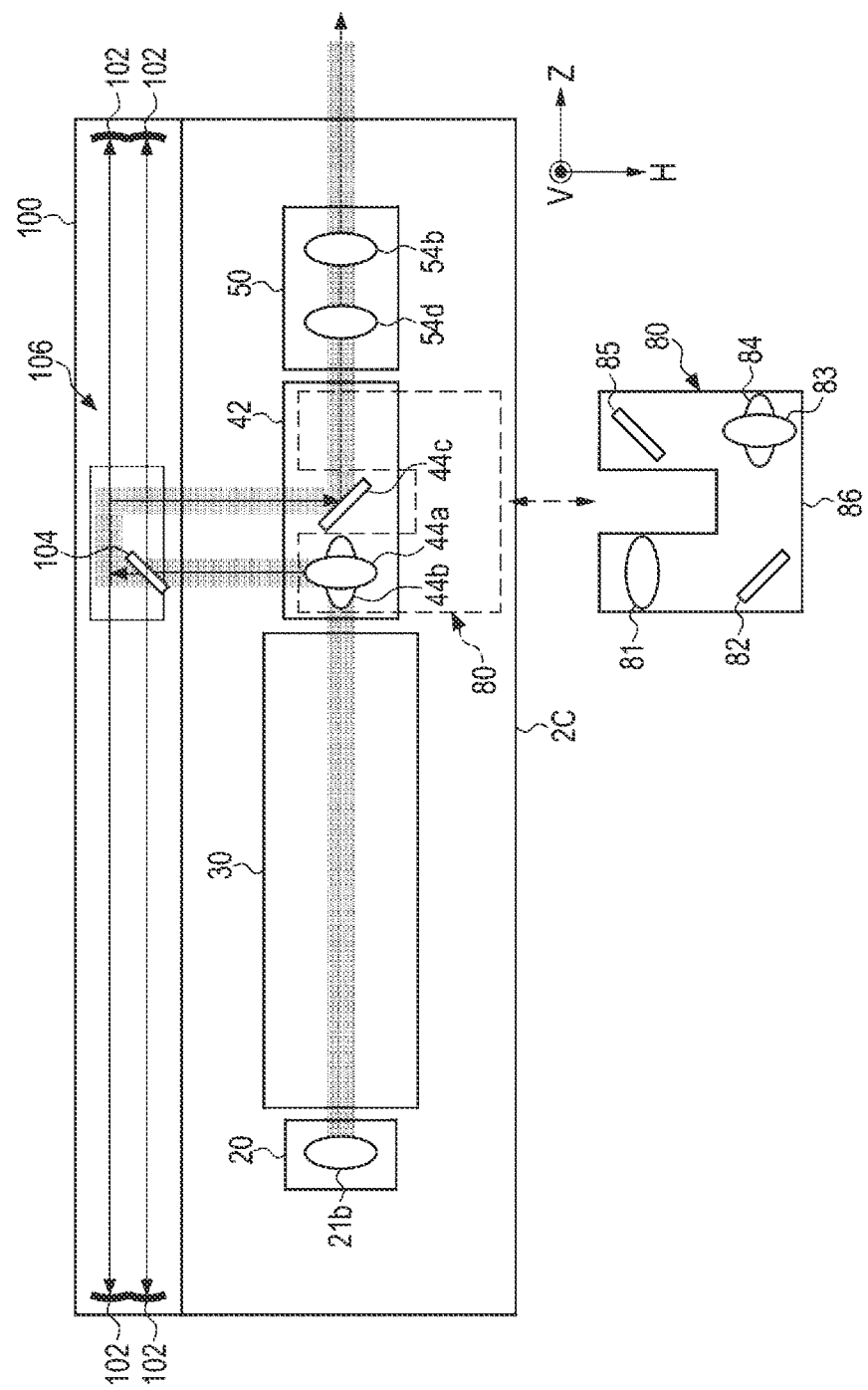
FIG. 10 is a top view schematically showing the configuration of a laser apparatus according to a third embodiment.
Figure 11:
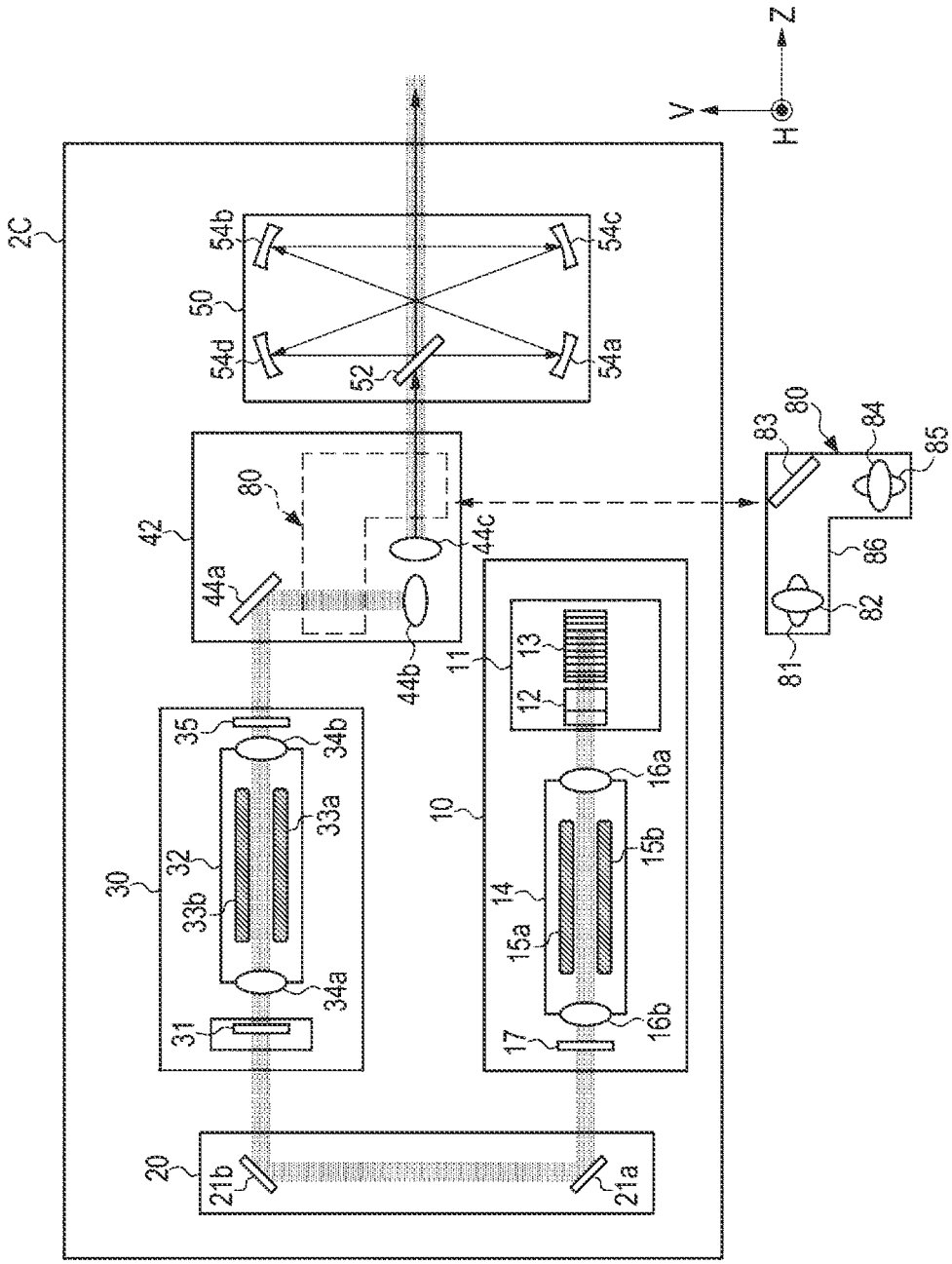
FIG. 11 is a front view schematically showing the configuration of the laser apparatus according to the third embodiment.

FIG. 10 is a top view schematically showing the configuration of the laser apparatus 2C according to the third embodiment. FIG. 11 is a front view schematically showing the configuration of the laser apparatus 2C. The laser apparatus 2C is so configured that a bypass apparatus 80 is attachable to and detachable from the laser apparatus 2C in place of the bypass apparatus 70 in the second embodiment. The bypass apparatus 80 is attachable to and detachable from the laser apparatus 2C via the front surface thereof, that is, the surface via which maintenance is performed. The other configurations of the laser apparatus 2C are the same as those of the laser apparatus 2B according to the second embodiment.

The bypass apparatus 80 includes five highly reflective mirrors 81 to 85. The highly reflective mirrors 81 to 85 are an example of the "plurality of optical elements" in the present disclosure. The highly reflective mirror 81 is an example of the "first highly reflective mirror" in the present disclosure. The highly reflective mirror 85 is an example of the "second highly reflective mirror" in the present disclosure.

The highly reflective mirrors 81 to 85 are housed in an enclosure 86 and held at predetermined positions in the enclosure 86. The highly reflective mirrors 81 to 85 form a bypass optical path that bypasses the L-OPS 100.

In the laser apparatus 2C, a space into which a portion of the bypass apparatus 80 can be inserted is secured in the PO beam steering unit 42. The enclosure 86 of the bypass apparatus 80 is attachable to and detachable from the laser apparatus 2C. In FIGS. 10 and 11, the broken line indicates the position where the bypass apparatus 80 is attached to the laser apparatus 2C. The enclosure 86 is positioned and fixed with respect to the PO beam steering unit 42 when attached to the laser apparatus 2C. In FIGS. 10 and 11, the solid line indicates the state in which the bypass apparatus 80 is detached from the laser apparatus 2C.

Figure 12:
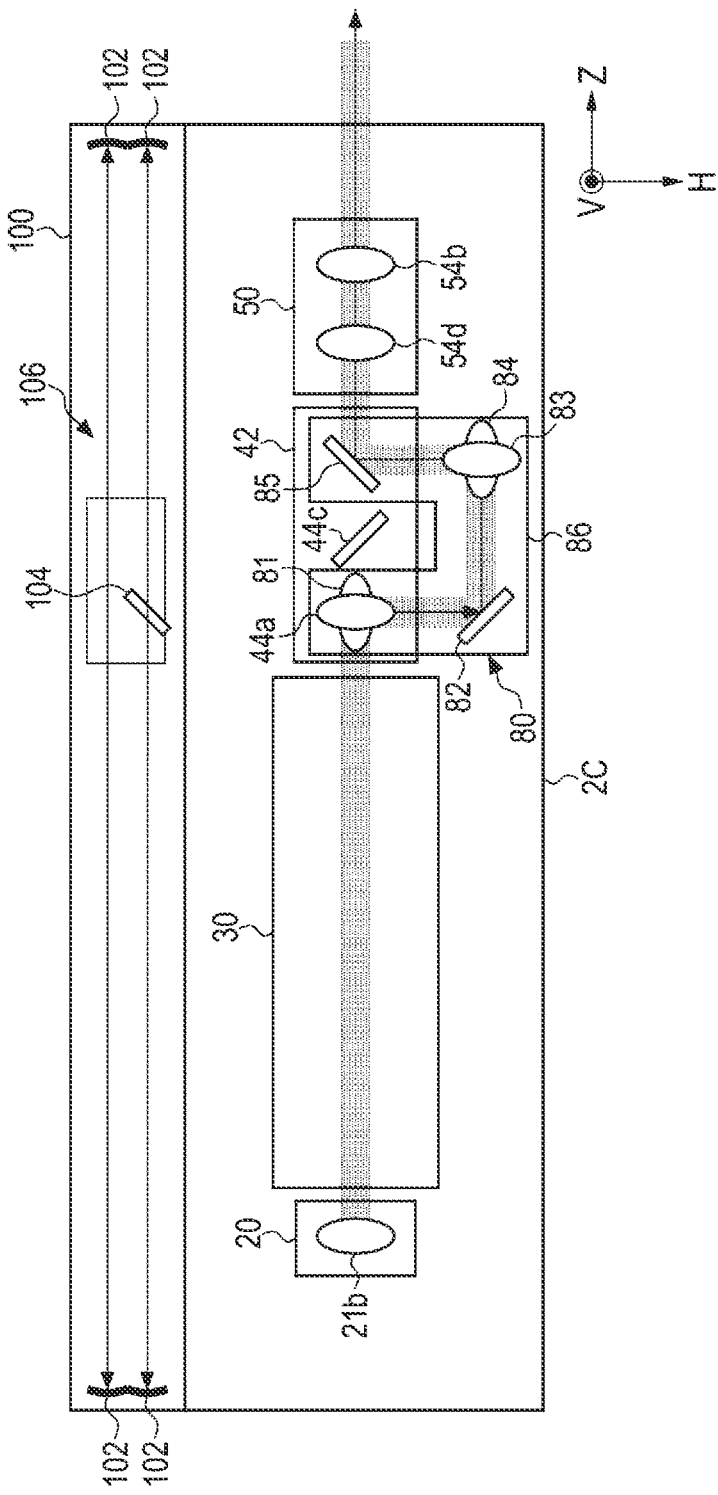
FIG. 12 is a top view showing the state in which a bypass apparatus is attached to the laser apparatus according to the third embodiment.
Figure 13:
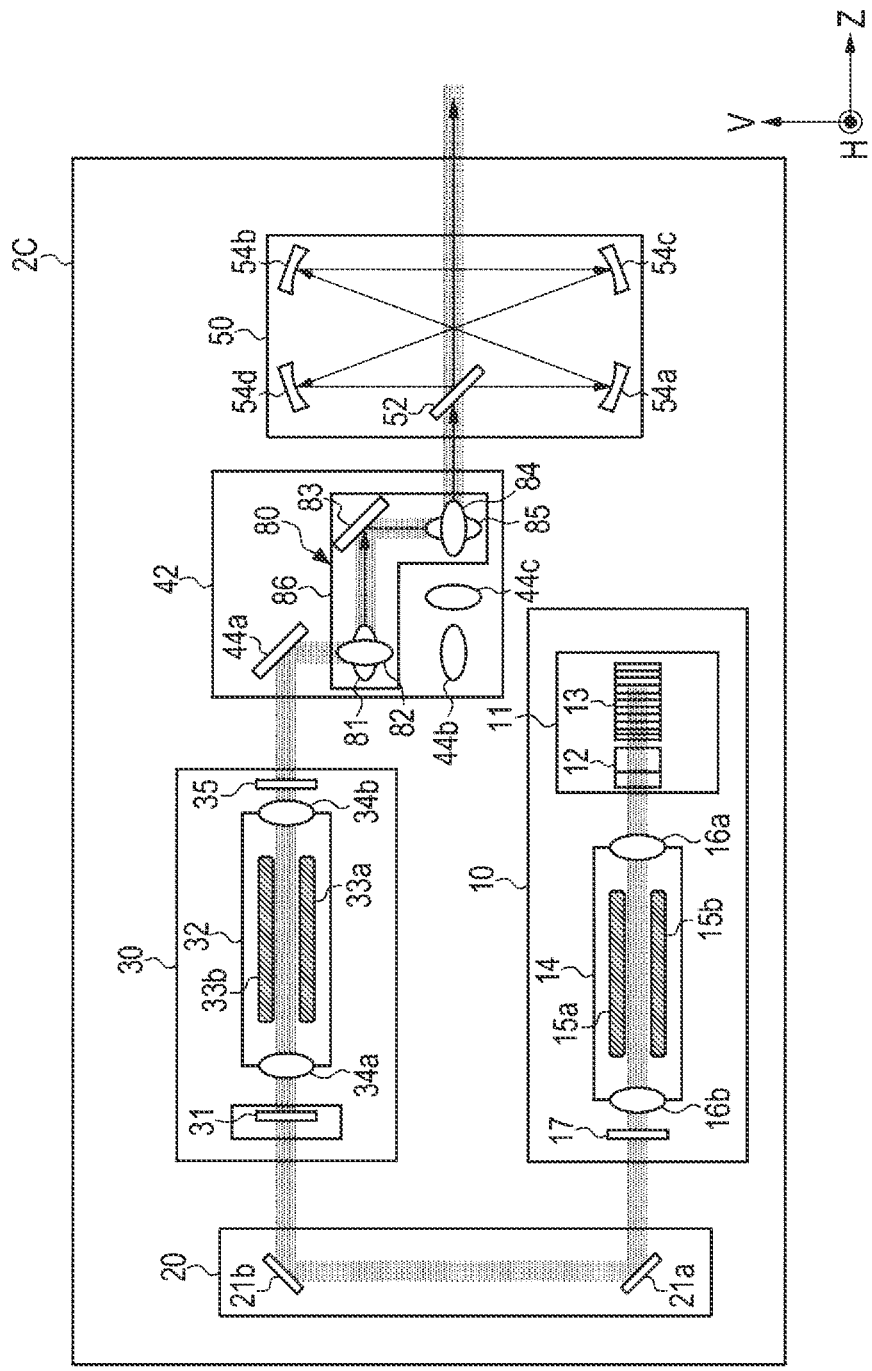
FIG. 13 is a front view showing the state in which the bypass apparatus is attached to the laser apparatus according to the third embodiment.

FIGS. 12 and 13 show the state in which the bypass apparatus 80 is attached to the laser apparatus 2C. In the state in which the bypass apparatus 80 is attached to the laser apparatus 2C, the highly reflective mirrors 81 to 84 are located to successively receive the pulse laser light reflected off the highly reflective mirror 44a of the PO beam steering unit 42.

The highly reflective mirror 85 is disposed to reflect the pulse laser light incident from the highly reflective mirror 84 and cause the reflected pulse laser light to enter the OPS 50. That is, the highly reflective mirror 85 is disposed to output the pulse laser light along the light-exiting-side optical axis of the PO beam steering unit 42.

Figure 14:
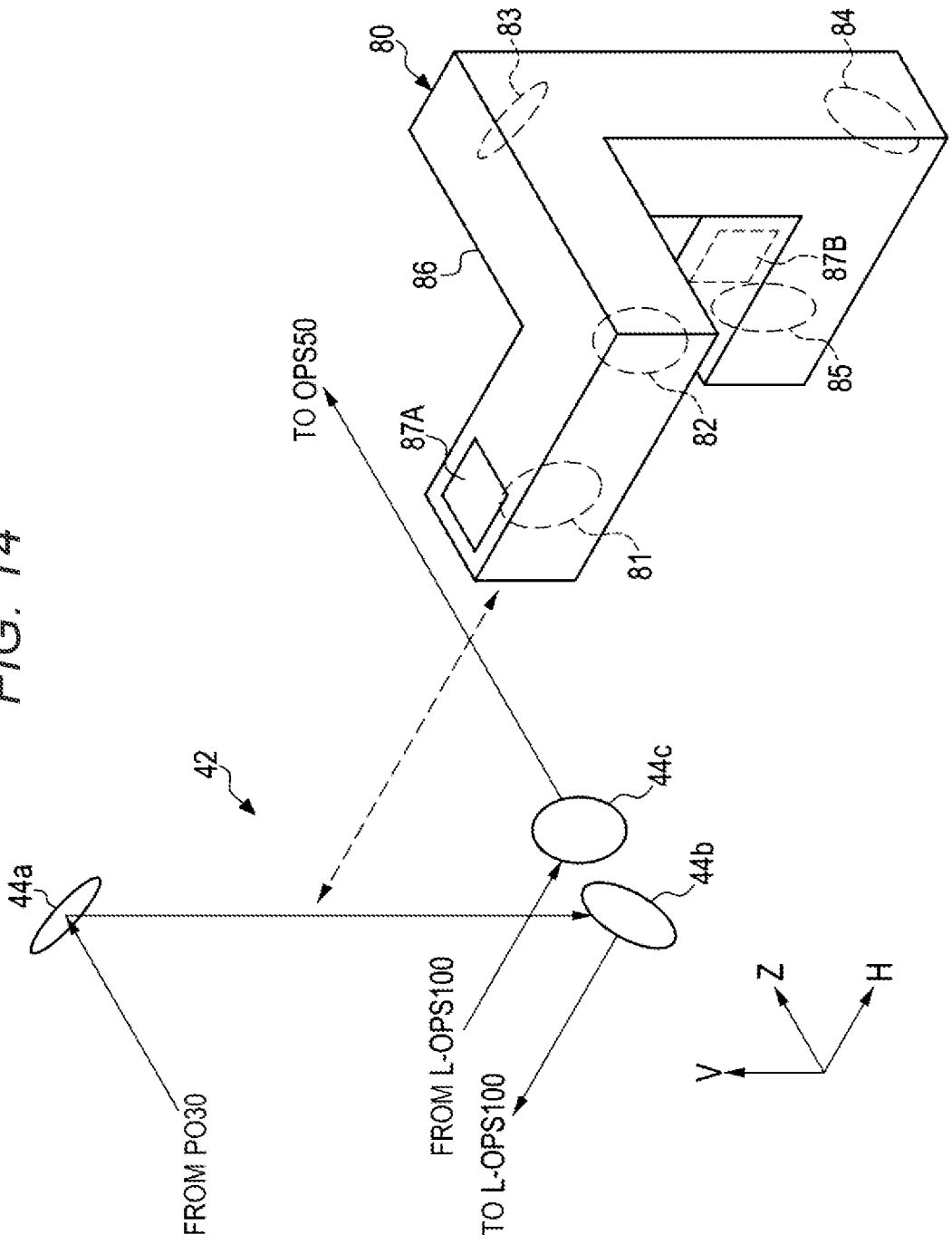
FIG. 14 is a perspective view showing the state in which the bypass apparatus is detached from the laser apparatus according to the third embodiment.
Figure 15:
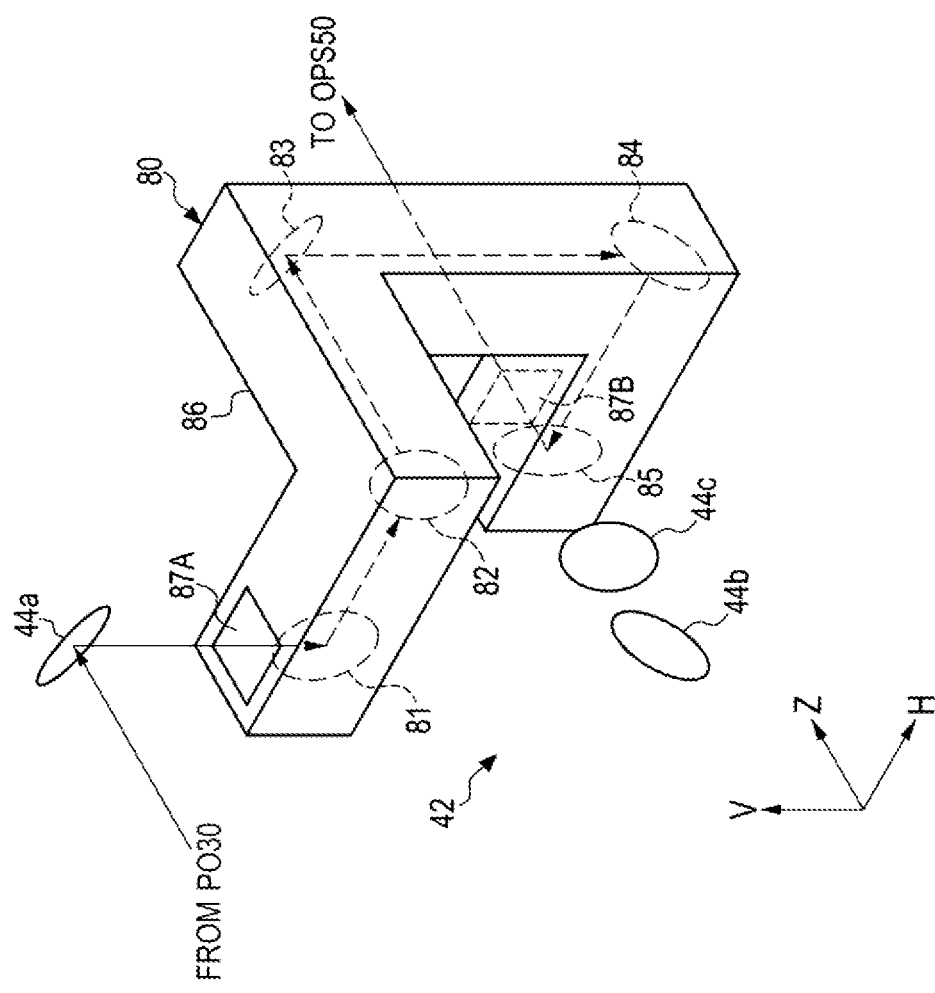
FIG. 15 is a perspective view showing the state in which the bypass apparatus is attached to the laser apparatus according to the third embodiment.

FIGS. 14 and 15 are perspective views schematically showing the configuration of the bypass apparatus 80. FIG. 14 shows the state in which the bypass apparatus 80 is detached from the laser apparatus 2C. FIG. 15 shows the state in which the bypass apparatus 80 is attached to the laser apparatus 2C.

A light incident window 87A is formed in the enclosure 86 of the bypass apparatus 80 to allow the pulse laser light reflected off the highly reflective mirror 44a of the PO beam steering unit 42 to be incident on the highly reflective mirror 81. A light exiting window 87B is formed in the enclosure 86 to allow the pulse laser light reflected off the highly reflective mirror 85 to exit out of the enclosure 86.

The highly reflective mirror 81 is disposed to reflect the pulse laser light reflected off the highly reflective mirror 44a of the PO beam steering unit 42 and traveling toward the negative end of the V-axis direction and cause the reflected pulse laser light to travel toward the positive end of the H-axis direction, as shown in FIG. 15. The highly reflective mirror 82 is disposed to reflect the pulse laser light traveling toward the positive end of the H-axis direction and cause the reflected pulse laser light to travel toward the positive end of the Z-axis direction. The highly reflective mirror 83 is disposed to reflect the pulse laser light traveling toward the positive end of the Z-axis direction and cause the reflected pulse laser light to travel toward the negative end of the V-axis direction. The highly reflective mirror 84 is disposed to reflect the pulse laser light traveling toward the negative end of the V-axis direction and cause the reflected pulse laser light to travel toward the negative end of the H-axis direction. The highly reflective mirror 85 is disposed to reflect the pulse laser light traveling toward the negative end of the H-axis direction and cause the reflected pulse laser light to travel toward the positive end of the Z-axis direction. That is, the highly reflective mirrors 81 to 85 are each so disposed that the angle between the light incident on the mirror and the light reflected off the mirror is 90°.

The highly reflective mirrors 81 to 85 may each be so disposed that the angle between the light incident on the mirror and the light reflected off the mirror is not 90°. The highly reflective mirror 81 as the first highly reflective mirror only needs to be disposed so as to guide the pulse laser light to the bypass optical path by reflecting the pulse laser light entering the L-OPS 100 out of the L-OPS 100. The highly reflective mirror 85 as the second highly reflective mirror only needs to be disposed so as to cause the pulse laser light to return to the light-exiting-side optical path of the L-OPS 100 by reflecting the pulse laser light reflected off the highly reflective mirror 81 and incident on the highly reflective mirror 85 via the bypass optical path. The light-exiting-side optical path of the L-OPS 100 refers to the optical path of the pulse laser light output from the L-OPS 100 and traveling until the pulse laser light enters the OPS 50.

4.2 Operation

The operation of the laser apparatus 2C performed when the bypass apparatus 80 is not attached thereto is the same as the operation of the laser apparatus 2B according to the second embodiment. The pulse laser light output from the power oscillator 30 travels in the direction changed by the PO beam steering unit 42 and enters the L-OPS 100 at the rear surface of the laser apparatus 2C. The pulse laser light having entered the L-OPS 100, after the pulse width thereof is extended by the L-OPS 100, returns to the PO beam steering unit 42, which changes the traveling direction of the pulse laser light, and the resultant pulse laser light enters the OPS 50. The pulse width of the pulse laser light having entered the OPS 50 is further extended by the OPS 50, and the resultant pulse laser light exits out of the laser apparatus 2C.

The bypass apparatus 80 is attached to the laser apparatus 2C, for example, when the pulse laser light output from the laser apparatus 2C has abnormal laser performance and during the investigation work for identifying the cause of the abnormality. When the bypass apparatus 80 is attached to the laser apparatus 2C, the traveling direction of the pulse laser light output from the power oscillator 30 is changed by the highly reflective mirror 44a of the PO beam steering unit 42, and the resultant pulse laser light then enters the bypass apparatus 80. The pulse laser light having entered the bypass apparatus 80 travels along the bypass optical path without passing through the L-OPS 100, and is output along the light-exiting-side optical axis of the PO beam steering unit 42. The pulse laser light output from the bypass apparatus 80 enters the OPS 50, which extends the pulse width of the pulse laser light, and the resultant pulse laser light exits out of the laser apparatus 2C.

4.3 Effects

The laser apparatus 2C and the bypass apparatus 80 according to the third embodiment, in which the bypass apparatus 80 is attached to the laser apparatus 2C, can output the pulse laser light with the L-OPS 100 attached to the laser apparatus 2C but the pulse laser light bypassing the L-OPS 100. In particular, the bypass apparatus 80 according to the third embodiment can be attached to and detached from the laser apparatus 2C via the front surface thereof, that is, the surface via which maintenance is performed, so that the attachment work is readily performed.

In addition to the above, the laser apparatus 2C and the bypass apparatus 80 according to the third embodiment provide the same effects as those provided by the laser apparatus 2B and the bypass apparatus 70 according to the second embodiment.

5. Modifications of Bypass Apparatus

Modifications of the bypass apparatus will next be described. It is assumed that the bypass apparatuses according to the modifications can adjust the optical axis of the bypass optical path.

5.1 First Modification

Figure 16:
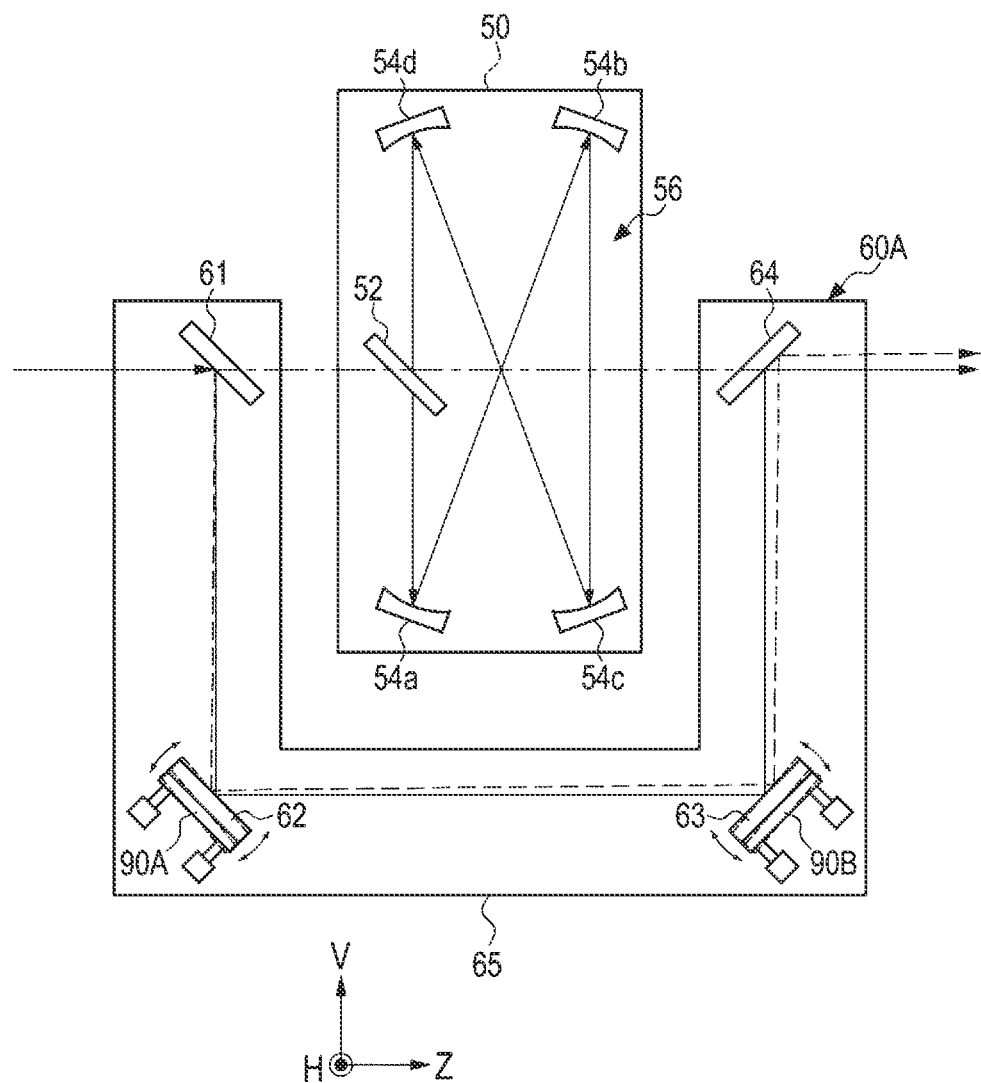
FIG. 16 schematically shows the configuration of a bypass apparatus according to a first modification of the first embodiment.

FIG. 16 schematically shows the configuration of a bypass apparatus 60A according to a first modification of the first embodiment. The bypass apparatus 60A includes the four highly reflective mirrors 61 to 64, which form the bypass optical path, as the bypass apparatus 60 according to the first embodiment does.

The highly reflective mirror 62 out of the highly reflective mirrors 61 to 64 is held by a first actuator-equipped holder 90A, and the highly reflective mirror 63 is held by a second actuator-equipped holder 90B. The first actuator-equipped holder 90A and the second actuator-equipped holder 90B are housed in the enclosure 65 along with highly reflective mirrors 61 to 64. The first actuator-equipped holder 90A and the second actuator-equipped holder 90B are an example of the "optical axis adjustment mechanism" in the present disclosure. The highly reflective mirror 62 is an example of the "first optical element" in the present disclosure. The highly reflective mirror 63 is an example of the "second optical element" in the present disclosure.

The first actuator-equipped holder 90A and the second actuator-equipped holder 90B are each formed, for example, of a holder, a PZT (lead zirconate titanate) actuator, and an automatic micrometer.

The first actuator-equipped holder 90A holds the highly reflective mirror 62 and changes the angle of the posture of the highly reflective mirror 62 around two axes perpendicular to each other. For example, the first actuator-equipped holder 90A rotates the highly reflective mirror 62 around the H-axis and around the axis parallel to the surface of the highly reflective mirror 62 and perpendicular to the H-axis.

Similarly, the second actuator-equipped holder 90B holds the highly reflective mirror 63 and changes the angle of the posture of the highly reflective mirror 63 around two axes perpendicular to each other. For example, the second actuator-equipped holder 90B rotates the highly reflective mirror 63 around the H-axis and around the axis parallel to the surface of the highly reflective mirror 63 and perpendicular to the H-axis. The first actuator-equipped holder 90A and the second actuator-equipped holder 90B are controlled by a controller (not shown).

The optical axis of the bypass optical path can be adjusted by changing the angle of the posture of each of the highly reflective mirrors 62 and 63 around the two axes. Specifically, the traveling direction and position of the pulse laser light traveling along the bypass optical path can be adjusted.

When the bypass apparatus 60A is attached to the laser apparatus 2A according to the first embodiment, there is a possibility of misalignment between the light-exiting-side optical axis of the OPS 50 and the light-exiting-side optical axis of the bypass apparatus 60A. Even when such misalignment occurs, controlling the first actuator-equipped holder 90A and the second actuator-equipped holder 90B allows the light-exiting-side optical axis of the bypass apparatus 60A to coincide with the light-exiting-side optical axis of the OPS 50.

The two mirrors in the example shown in FIG. 16 are not necessarily adjusted, and any two of the highly reflective mirrors 61 to 64 may be held with the first actuator-equipped holder 90A and the second actuator-equipped holder 90B.

5.2 Second Modification

Figure 17:
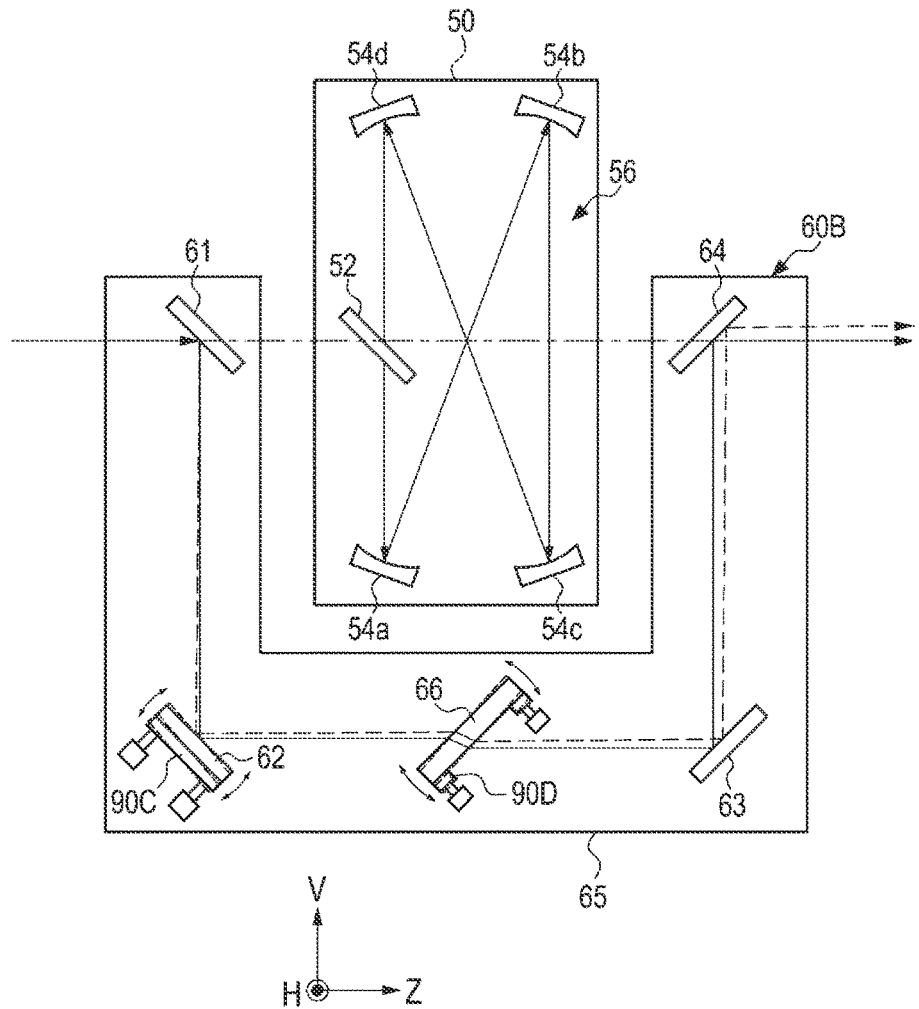
FIG. 17 schematically shows the configuration of a bypass apparatus according to a second modification of the first embodiment.

FIG. 17 schematically shows the configuration of a bypass apparatus 60B according to a second modification of the first embodiment. The bypass apparatus 60B includes the four highly reflective mirrors 61 to 64 and a light transmissive plane parallel substrate 66. The plane parallel substrate 66 is made, for example, of synthetic quartz or calcium fluoride ($CaF_2$). The highly reflective mirrors 61 to 64 and the plane parallel substrate 66 are an example of the "plurality of optical elements" in the present disclosure.

The highly reflective mirror 62 out of the highly reflective mirrors 61 to 64 is held by a first actuator-equipped holder 90C. The first actuator-equipped holder 90C has the same configuration as that of the first actuator-equipped holder 90A described in the first modification, holds the highly reflective mirror 62, and changes the angle of the posture of the highly reflective mirror 62 around the two axes perpendicular to each other. The first actuator-equipped holder 90C and a second actuator-equipped holder 90D are housed in the enclosure 65 along with the highly reflective mirrors 61 to 64 and the plane parallel substrate 66. The first actuator-equipped holder 90C and the second actuator-equipped holder 90D are an example of the "optical axis adjustment mechanism" in the present disclosure. The highly reflective mirror 62 is an example of the "first optical element" in the present disclosure.

The plane parallel substrate 66 is disposed on the optical path along which the pulse laser light reflected off the highly reflective mirror 62 travels toward the highly reflective mirror 63 with the plane parallel substrate 66 inclining with respect to the optical path. The plane parallel substrate 66 transmits the pulse laser light incident from the highly reflective mirror 62 and causes the pulse laser light to be incident on the highly reflective mirror 63. The plane parallel substrate 66 is an example of the "second optical element" in the present disclosure.

The plane parallel substrate 66 is held by the second actuator-equipped holder 90D. The second actuator-equipped holder 90D has the same configuration as that of the first actuator-equipped holder 90A described in the first modification, holds the plane parallel substrate 66, and changes the angle of the posture of the plane parallel substrate 66 around two axes perpendicular to each other. For example, the second actuator-equipped holder 90D rotates the plane parallel substrate 66 around the H-axis and around the axis parallel to the surface of the plane parallel substrate 66 and perpendicular to the H-axis. The first actuator-equipped holder 90C and the second actuator-equipped holder 90D are controlled by the controller (not shown).

The optical axis of the bypass optical path can be adjusted by changing the angle of the posture of each of the highly reflective mirror 62 and the plane parallel substrate 66 around the two axes. Specifically, the traveling direction of the pulse laser light traveling along the bypass optical path can be adjusted by changing the angle of the posture of the highly reflective mirror 62.

The position of the pulse laser light can be adjusted by changing the angle of the posture of the plane parallel substrate 66. The amount of change in the position of the pulse laser light made when the pulse laser light passes through the plane parallel substrate 66 depends on the angle of incidence of the pulse laser light incident on the plane parallel substrate 66, the thickness of the plane parallel substrate 66, and the refractive index of the plane parallel substrate 66. Changing the angle of the posture of the plane parallel substrate 66 changes the angle of incidence of the pulse laser light incident on the plane parallel substrate 66, so that the position of the pulse laser light changes.

In the example shown in FIG. 17, the highly reflective mirror 62 is held by the first actuator-equipped holder 90C as the optical axis adjustment mechanism, and any of the highly reflective mirrors 61 to 64 may be held by the first actuator-equipped holder 90C.

In the example shown in FIG. 17, the plane parallel substrate 66 is disposed between the highly reflective mirrors 62 and 63. Instead, the plane parallel substrate 66 may be disposed between the highly reflective mirrors 61 and 62 or between the highly reflective mirrors 63 and 64. Still instead, the plane parallel substrate 66 may be disposed at the light incident side of the highly reflective mirror 61 or at the light exiting side of the highly reflective mirror 64.

5.3 Other Modifications

The highly reflective mirrors 72 and 74 accommodated in the bypass apparatus 70 according to the second embodiment may each be provided with an actuator-equipped holder as the optical axis adjustment mechanism. Instead, one of the highly reflective mirrors 72 and 74 may be provided with an actuator-equipped holder, and a plane parallel substrate held by an actuator-equipped holder may be disposed between the highly reflective mirrors 72 and 74. Still instead, a plane parallel substrate held by an actuator-equipped holder may be disposed at the light incident side of the highly reflective mirror 72 or at the light exiting side of the highly reflective mirror 74. Furthermore, the light incident window 78A and the light exiting window 78B are not essentially provided, and may be replaced with openings through which light passes.

Any two of the highly reflective mirrors 81 to 85 accommodated in the bypass apparatus 80 according to the third embodiment may each be provided with an actuator-equipped holder. Instead, one highly reflective mirror selected from the highly reflective mirrors 81 to 85 may be provided with an actuator-equipped holder, and a plane parallel substrate held by an actuator-equipped holder may be disposed between two highly reflective mirrors selected from the highly reflective mirrors 81 to 85. Still instead, a plane parallel substrate held by an actuator-equipped holder may be disposed at the light incident side of the highly reflective mirror 81 or at the light exiting side of the highly reflective mirror 85. Furthermore, the light incident window 87A and the light exiting window 87B are not essentially provided, and may be replaced with openings through which light passes.

Three or more of the plurality of optical elements that constitute the bypass optical path may each be provided with the actuator-equipped holder as the optical axis adjustment mechanism. Two or more of the plurality of optical elements that constitute the bypass optical path may each be a plane parallel substrate, which may be provided with an actuator-equipped holder.

6. Electronic Device Manufacturing Method

Figure 18:
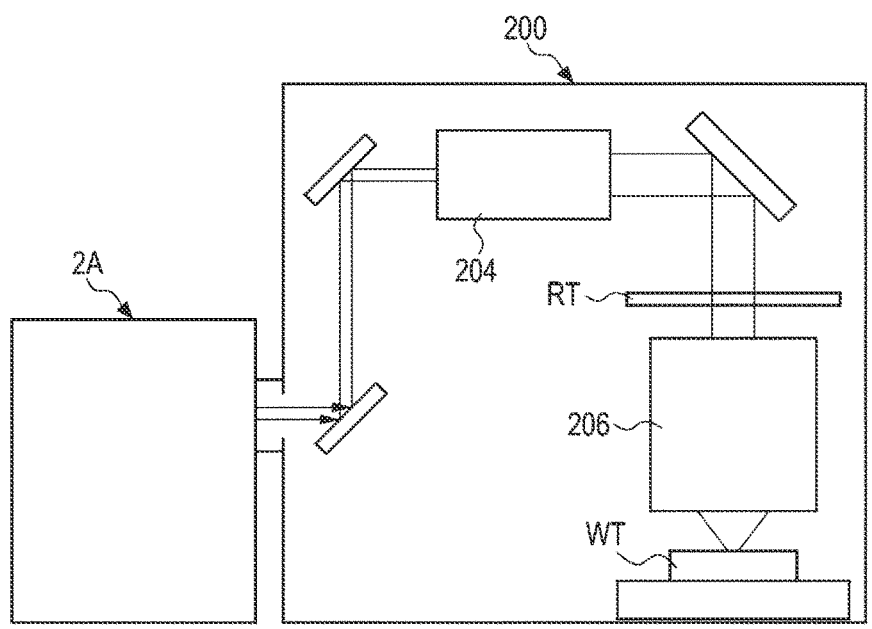
FIG. 18 schematically shows an example of the configuration of an exposure apparatus.

FIG. 18 schematically shows an example of the configuration of an exposure apparatus 200. The exposure apparatus 200 includes an illumination optical system 204 and a projection optical system 206. The illumination optical system 204 illuminates a reticle pattern of a reticle that is not shown but is placed on a reticle stage RT, for example, with the pulse laser light having entered the exposure apparatus 200 from the laser apparatus 2A according to the first embodiment. The projection optical system 206 performs reduction projection on the pulse laser light having passed through the reticle to bring the pulse laser light into focus on a workpiece that is not shown but is placed on a workpiece table WT. The workpiece is a photosensitive substrate onto which a photoresist has been applied, such as a semiconductor wafer.

The exposure apparatus 200 translates the reticle stage RT and the workpiece table WT in synchronization with each other to expose the workpiece to the pulse laser light having reflected the reticle pattern. Semiconductor devices can be manufactured by transferring the reticle pattern onto the semiconductor wafer in the exposure step described above and then carrying out a plurality of other steps. The semiconductor devices are an example of the "electronic devices" in the present disclosure.

The bypass apparatus 60 may be attached to the laser apparatus 2A, which causes the pulse laser light to enter the exposure apparatus 200, or the bypass apparatus 60 may be detached from the laser apparatus 2A. In the wafer exposure process, attaching and detaching the bypass apparatus 60 to and from the laser apparatus 2A allows selection of which of the pulse width and the output of the pulse laser light should be prioritized. The laser apparatus 2A is not necessarily used, and the laser apparatus 2B or 2C described above or any other laser apparatus may be used.

The description above is intended to be illustrative and the present disclosure is not limited thereto. Therefore, it would be obvious to those skilled in the art that various modifications to the embodiments of the present disclosure would be possible without departing from the spirit and the scope of the appended claims.

The terms used throughout the present specification and the appended claims should be interpreted as non-limiting terms. For example, the term "include" or "included" should be construed as "does not necessarily include only what is described". The term "have" should be construed as "does not necessarily have only what is described". Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of the any thereof and any other than A, B, and C.

What is claimed is:

1. A bypass apparatus attachable to and detachable from a laser apparatus configured to output pulse laser light, the bypass apparatus constituting a bypass optical path that bypasses a pulse width stretching apparatus provided in the laser apparatus and configured to stretch a pulse width of the pulse laser light having entered the pulse width stretching apparatus, the bypass apparatus comprising:
    a plurality of optical elements constituting the bypass optical path; and
    an enclosure that houses the plurality of optical elements, the plurality of optical elements including
    a first highly reflective mirror configured to reflect the pulse laser light entering the pulse width stretching apparatus out of the pulse width stretching apparatus, the first highly reflective mirror being configured to guide the reflected pulse laser light to the bypass optical path, and
    a second highly reflective mirror configured to reflect the pulse laser light reflected off the first highly reflective mirror and incident on the second highly reflective mirror through the bypass optical path to cause the reflected pulse laser light to return to a light-exiting-side optical path of the pulse width stretching apparatus.

2. The bypass apparatus according to claim 1, further comprising
    an optical axis adjustment mechanism configured to adjust an optical axis of the bypass optical path.

3. The bypass apparatus according to claim 2,
wherein the optical axis adjustment mechanism includes a first actuator-equipped holder configured to hold a first optical element out of the plurality of optical elements and change an angle of a posture of the first optical element, and a second actuator-equipped holder configured to hold a second optical element out of the plurality of optical elements and change an angle of a posture of the second optical element.

4. The bypass apparatus according to claim 3,
wherein the first and second optical elements are each highly reflective mirror.

5. The bypass apparatus according to claim 3,
wherein the first optical element is a highly reflective mirror, and
the second optical element is a light transmissive plane parallel substrate.

6. The bypass apparatus according to claim 1,
wherein the first highly reflective mirror is configured to reflect the pulse laser light output from a beam steering apparatus configured to change a traveling direction of the pulse laser light incident thereon, and
the second highly reflective mirror is configured to reflect the pulse laser light incident thereon through the bypass optical path and output the reflected pulse laser light along a light-exiting-side optical axis of the pulse width stretching apparatus to cause the pulse laser light to return to the light-exiting-side optical path.

7. The bypass apparatus according to claim 1,
wherein the first highly reflective mirror is configured to reflect the pulse laser light output from a single highly reflective mirror accommodated in a beam steering apparatus configured to change a traveling direction of the pulse laser light incident thereon, and
the second highly reflective mirror is configured to reflect the pulse laser light incident thereon through the bypass optical path and output the reflected pulse laser light along a light-exiting-side optical axis of the pulse width stretching apparatus to cause the pulse laser light to return to the beam steering apparatus.

8. The bypass apparatus according to claim 1,
wherein the first highly reflective mirror is configured to reflect the pulse laser light output from a single highly reflective mirror accommodated in a beam steering apparatus configured to change a traveling direction of the pulse laser light incident thereon, and
the second highly reflective mirror is configured to reflect the pulse laser light incident thereon through the bypass optical path and output the reflected pulse laser light along a light-exiting-side optical axis of the beam steering apparatus to cause the pulse laser light to return to the light-exiting-side optical path.

9. A laser apparatus comprising: a laser oscillator configured to output pulse laser light; and a pulse width stretching apparatus configured to stretch a pulse width of the pulse laser light having entered the pulse width stretching apparatus, a bypass apparatus being attached to the laser apparatus in a detachable manner, the bypass apparatus constituting a bypass optical path that bypasses the pulse width stretching apparatus,
    the bypass apparatus including
    a plurality of optical elements constituting the bypass optical path, and
    an enclosure that houses the plurality of optical elements, the plurality of optical elements including
    a first highly reflective mirror configured to reflect the pulse laser light entering the pulse width stretching apparatus out of the pulse width stretching apparatus, the first highly reflective mirror being configured to guide the reflected pulse laser light to the bypass optical path, and
    a second highly reflective mirror configured to reflect the pulse laser light reflected off the first highly reflective mirror and incident on the second highly reflective mirror through the bypass optical path to cause the reflected pulse laser light to return to a light-exiting-side optical path of the pulse width stretching apparatus.

10. An electronic device manufacturing method comprising:
    outputting pulse laser light output from a laser apparatus to an exposure apparatus; and exposing a photosensitive substrate to the pulse laser light in the exposure apparatus to manufacture electronic devices, the laser apparatus including a laser oscillator configured to output the pulse laser light and a pulse width stretching apparatus configured to stretch a pulse width of the pulse laser light having entered the pulse width stretching apparatus, a bypass apparatus attached to the laser apparatus in a detachable manner, the bypass apparatus constituting a bypass optical path that bypasses the pulse width stretching apparatus, the bypass apparatus including a plurality of optical elements constituting the bypass optical path, and an enclosure that houses the plurality of optical elements, the plurality of optical elements including a first highly reflective mirror configured to reflect the pulse laser light entering the pulse width stretching apparatus out of the pulse width stretching apparatus, the first highly reflective mirror being configured to guide the reflected pulse laser light to the bypass optical path, and a second highly reflective mirror configured to reflect the pulse laser light reflected off the first highly reflective mirror and incident on the second highly reflective mirror through the bypass optical path to cause the reflected pulse laser light to return to a light-exiting-side optical path of the pulse width stretching apparatus.

* * * * *